(12) United States Patent
Park

(10) Patent No.: US 10,910,074 B2
(45) Date of Patent: Feb. 2, 2021

(54) MEMORY CONTROLLER AND METHOD OF OPERATING THE SAME

(71) Applicant: SK hynix Inc., Icheon-si (KR)

(72) Inventor: Se Chang Park, Cheongju-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 16/426,418

(22) Filed: May 30, 2019

(65) Prior Publication Data

US 2020/0135283 A1 Apr. 30, 2020

(30) Foreign Application Priority Data

Oct. 25, 2018 (KR) ........................ 10-2018-0128448

(51) Int. Cl.
*G11C 16/16* (2006.01)
*G11C 16/34* (2006.01)
*G06F 3/06* (2006.01)

(52) U.S. Cl.
CPC ........ *G11C 16/3413* (2013.01); *G06F 3/0604* (2013.01); *G06F 3/0652* (2013.01); *G06F 3/0658* (2013.01); *G06F 3/0673* (2013.01); *G11C 16/16* (2013.01)

(58) Field of Classification Search
CPC ................................ G11C 16/10; G11C 16/14
USPC ........................................ 365/185.24, 185.29
See application file for complete search history.

(56) References Cited

U.S. PATENT DOCUMENTS

| 5,805,501 | A  | * | 9/1998  | Shiau ...................... G11C 16/16 365/185.29 |
| 6,279,070 | B1 | * | 8/2001  | Jeong ...................... G11C 16/16 365/185.29 |
| 8,130,550 | B1 | * | 3/2012  | Confalonieri .......... G11C 16/16 365/185.11 |
| 8,351,276 | B2 | * | 1/2013  | Choy ................. G11C 16/0483 365/185.22 |
| 9,384,842 | B1 | * | 7/2016  | Roy .................... G11C 16/3409 |
| 9,627,079 | B1 | * | 4/2017  | Hong ...................... G11C 16/16 |
| 2005/0276129 | A1 | * | 12/2005 | Meihong .............. G11C 29/846 365/200 |
| 2008/0002468 | A1 | * | 1/2008  | Hemink .............. G06F 11/1068 365/185.17 |

(Continued)

FOREIGN PATENT DOCUMENTS

KR 10-2014-0055738 5/2014
KR 10-2015-0091670 8/2015

*Primary Examiner* — Michael T Tran
(74) *Attorney, Agent, or Firm* — Perkins Coie LLP

(57) ABSTRACT

Circuit designs and operating techniques for a storage device that includes, in one implementation, a memory controller configured to control a memory device including a plurality of memory blocks, each including a plurality of memory cells. The memory controller may include a memory device interface configured to perform data communication with the memory device, and a soft program controller communicatively coupled to the memory device interface and configured to count a number of iterations that an erase operation on an erase target memory block, among the plurality of memory blocks, has been suspended until the erase operation is completed, and to perform a soft program operation on the erase target memory block after the erase operation has been completed, based on the number of iterations that the erase operation on the erase target memory block has been suspended.

19 Claims, 19 Drawing Sheets

(56) References Cited

U.S. PATENT DOCUMENTS

| | | | |
|---|---|---|---|
| 2008/0089132 A1* | 4/2008 | Ito | G11C 16/3477 365/185.22 |
| 2008/0089133 A1* | 4/2008 | Ito | G11C 16/3445 365/185.22 |
| 2009/0034339 A1* | 2/2009 | Eguchi | G11C 16/3409 365/185.22 |
| 2009/0154252 A1* | 6/2009 | Shibata | G11C 16/14 365/185.22 |
| 2009/0244969 A1* | 10/2009 | Maejima | G11C 16/3413 365/185.03 |
| 2010/0246257 A1* | 9/2010 | Ito | G11C 11/5621 365/185.03 |
| 2011/0063917 A1* | 3/2011 | Shiino | G11C 11/5635 365/185.17 |
| 2011/0273936 A1* | 11/2011 | Yu | G11C 16/16 365/185.33 |
| 2012/0014179 A1* | 1/2012 | Choy | G11C 16/0483 365/185.3 |
| 2012/0044764 A1* | 2/2012 | Nakai | G11C 16/16 365/185.11 |
| 2012/0057410 A1* | 3/2012 | Yu | G11C 16/16 365/185.29 |
| 2012/0117307 A1* | 5/2012 | Eguchi | G11C 16/16 711/103 |
| 2012/0201082 A1* | 8/2012 | Choy | G11C 16/16 365/185.19 |
| 2013/0198451 A1* | 8/2013 | Hyun | G11C 16/225 711/114 |
| 2013/0242665 A1* | 9/2013 | Hung | G11C 16/14 365/185.19 |
| 2013/0314995 A1* | 11/2013 | Dutta | G11C 16/0483 365/185.17 |
| 2014/0063946 A1* | 3/2014 | Mu | G11C 16/3468 365/185.11 |
| 2014/0112080 A1* | 4/2014 | Carissimi | G11C 7/06 365/189.07 |
| 2014/0169093 A1* | 6/2014 | Parat | G11C 16/16 365/185.11 |
| 2014/0204694 A1* | 7/2014 | Choy | G11C 16/345 365/211 |
| 2014/0321211 A1* | 10/2014 | Mu | G11C 16/3445 365/185.19 |
| 2014/0321212 A1* | 10/2014 | Mu | G11C 16/34 365/185.19 |
| 2015/0049555 A1* | 2/2015 | Mu | G11C 16/3459 365/185.22 |
| 2015/0117114 A1* | 4/2015 | Wan | G11C 11/5642 365/185.21 |
| 2016/0042796 A1* | 2/2016 | Hsu | G11C 16/3445 365/185.11 |
| 2017/0047123 A1* | 2/2017 | Yano | G11C 16/0483 |
| 2017/0053703 A1* | 2/2017 | Georgescu | G11C 16/14 |
| 2017/0131947 A1* | 5/2017 | Hoang | G06F 11/3452 |
| 2017/0168752 A1* | 6/2017 | Micheloni | G06F 3/0604 |
| 2017/0285969 A1* | 10/2017 | Madraswala | G11C 16/225 |
| 2018/0004410 A1* | 1/2018 | Madraswala | G06F 3/061 |
| 2018/0130535 A1* | 5/2018 | Lee | G11C 16/3445 |
| 2018/0143762 A1* | 5/2018 | Kim | G11C 11/5642 |
| 2018/0151237 A1* | 5/2018 | Lee | G11C 16/14 |
| 2019/0095278 A1* | 3/2019 | Bi | H03M 13/1102 |

* cited by examiner

FIG. 11

SOFT PROGRAM SETTING TABLE a

| Suspend Count | Soft PGM Start Bias | Soft PGM Pulse Count | Soft PGM Pulse Bias |
|---|---|---|---|
| 0 | X_default | Y_default | Z_Default |
| 1 | X_1 | Y_1 | Z_1 |
| 2 | X_2 | Y_2 | Z_2 |
| ... | ... | ... | ... |
| n | X_n | Y_n | Z_n |

FIG. 12

SOFT PROGRAM SETTING TABLE b

| HEV Level | Soft PGM Start Bias | Soft PGM Pulse Count | Soft PGM Pulse Bias |
|---|---|---|---|
| HEV_default | X_default | Y_default | Z_Default |
| HEV_1 | X_1 | Y_1 | Z_1 |
| HEV_2 | X_2 | Y_2 | Z_2 |
| ... | ... | ... | ... |
| HEV_n | X_n | Y_n | Z_n |

MEMORY CONTROLLER AND METHOD OF OPERATING THE SAME

CROSS-REFERENCE TO RELATED APPLICATION

This patent document claims priority to and benefits of the Korean patent application number 10-2018-0128448 filed on Oct. 25, 2018, which is incorporated herein by reference in its entirety.

TECHNICAL FIELD

Various embodiments of the disclosed technology generally relate to an electronic device, and more particularly, to a memory controller and a method of operating the memory controller.

BACKGROUND

A storage device is a device that is capable of storing data in a storage medium. Such a storage device is used by computing devices such as a personal computer or a smartphone to store and retrieve data. The storage device may include a storage medium in which data is stored and a memory controller which controls storing and retrieving data. The storage device can be classified based on the type of storage medium. For example, a hard disk drive (HDD) uses a magnetic disk as the storage medium, and a solid-state drive (SSD) or a memory card uses, as the storage medium, semiconductor memory devices such as volatile memory devices and nonvolatile memory devices.

The volatile memory device retains stored data while powered on, but the stored data is lost when the supply of power is interrupted. Examples of the volatile memory device include a Static Random Access Memory (SRAM) and a Dynamic Random Access Memory (DRAM).

By contrast, the nonvolatile memory device can retain stored data even when the supply of power is interrupted. Examples of the nonvolatile memory device include a Read Only Memory (ROM), a Programmable ROM (PROM), an Electrically Programmable ROM (EPROM), an Electrically Erasable and Programmable ROM (EEPROM), and a flash memory.

SUMMARY

Various embodiments of the disclosed technology relate to a memory controller and a method of operating the memory controller for reducing/minimizing a potential over-erase phenomenon.

An embodiment of the present disclosure may provide for a memory controller for controlling a memory device including a plurality of memory blocks, each having a plurality of memory cells. The memory controller may include a memory device interface configured to perform data communication with the memory device, and a soft program controller configured to count a number of times that an erase operation on an erase target memory block, among the plurality of memory blocks, has been suspended until the erase operation is completed, and to perform a soft program operation on the erase target memory block after the erase operation has been completed, based on a counted result.

An embodiment of the present disclosure may provide for a method of operating a memory controller, the memory controller controlling a memory device including a plurality of memory blocks, each having a plurality of memory cells. The method may include providing an erase command for an erase target memory block, among the plurality of memory blocks, to the memory device, when suspension of an erase operation on the erase target memory block is requested, providing a suspend command for the erase target memory block to the memory device, after a suspend period corresponding to the suspend command has elapsed, providing an erase command for the erase target memory block to the memory device, when the erase operation is completed, counting a number of suspend commands provided to the memory device until the erase operation is completed, and providing a soft program command that instructs a soft program operation to be performed on the erase target memory block based on a counted result.

An embodiment of the present disclosure may provide for a memory controller for controlling a memory device including a plurality of memory blocks, each having a plurality of memory cells. The memory controller may include a soft program setting table configured to store soft program setting information that indicates soft program operating conditions depending on a level of a hard erase verify voltage, a suspend detector configured to count a number of times that an erase operation on an erase target memory block, among the plurality of memory blocks, has been suspended until the erase operation is completed, a verify voltage determinator configured to perform a hard erase verify operation on the erase target memory block based on a counted result, and decide on a level of a fail verify voltage that is a hard erase verify voltage when the erase target memory block fails the hard erase verify operation, and a soft program processor configured to perform a soft program operation on the erase target memory block based on the level of the fail verify voltage and the soft program setting information.

In another embodiment of the disclosed technology, a memory controller for controlling a memory device including a plurality of memory blocks, each including a plurality of memory cells, may include a memory device interface configured to perform data communication with the memory device, and a soft program control unit communicatively coupled to the memory device interface and configured to count a number of iterations that an erase operation on an erase target memory block, among the plurality of memory blocks, has been suspended until the erase operation is completed, and to perform a soft program operation on the erase target memory block after the erase operation has been completed, based on the number of iterations that the erase operation on the erase target memory block has been suspended.

In another embodiment of the disclosed technology, a method of operating a memory controller for controlling a memory device that includes a plurality of memory blocks, each of which includes a plurality of memory cells. The method may include providing, to the memory device, an erase command for an erase target memory block, among the plurality of memory blocks, providing, to the memory device, a suspend command for the erase target memory block when suspension of an erase operation on the erase target memory block is requested, providing, to the memory device, an erase command for the erase target memory block after a suspend period corresponding to the suspend command has elapsed, counting, upon completion of the erase operation, a number of suspend commands provided to the memory device until the erase operation is completed, and providing a soft program command instructing that a soft program operation be performed on the erase target memory block based on the number of suspend commands.

In another embodiment of the disclosed technology, a memory controller for controlling a memory device including a plurality of memory blocks, each including a plurality of memory cells, may include a soft program setting table configured to include soft program setting information that indicates soft program operating conditions depending on a level of a hard erase verify voltage, a suspend detection unit communicatively coupled to the memory device and configured to count a number of iterations that an erase operation on an erase target memory block, among the plurality of memory blocks, has been suspended until the erase operation is completed, a verify voltage determination unit communicatively coupled to the suspend detection unit and configured to perform a hard erase verify operation on the erase target memory block based on the number of iterations that the erase operation on the erase target memory block has been suspended, and decide on a level of a fail verify voltage that is a hard erase verify voltage when the erase target memory block fails verification at the hard erase verify operation, and a soft program processing unit communicatively coupled to the verify voltage determination unit and the soft program setting table and configured to perform a soft program operation on the erase target memory block based on the level of the fail verify voltage and the soft program setting information.

BRIEF DESCRIPTION OF THE DRAWINGS

FIG. 11 is a diagram illustrating an example of a soft program setting table.

FIG. 12 is a diagram illustrating an example of a soft program setting table.

DETAILED DESCRIPTION

Figure 1:
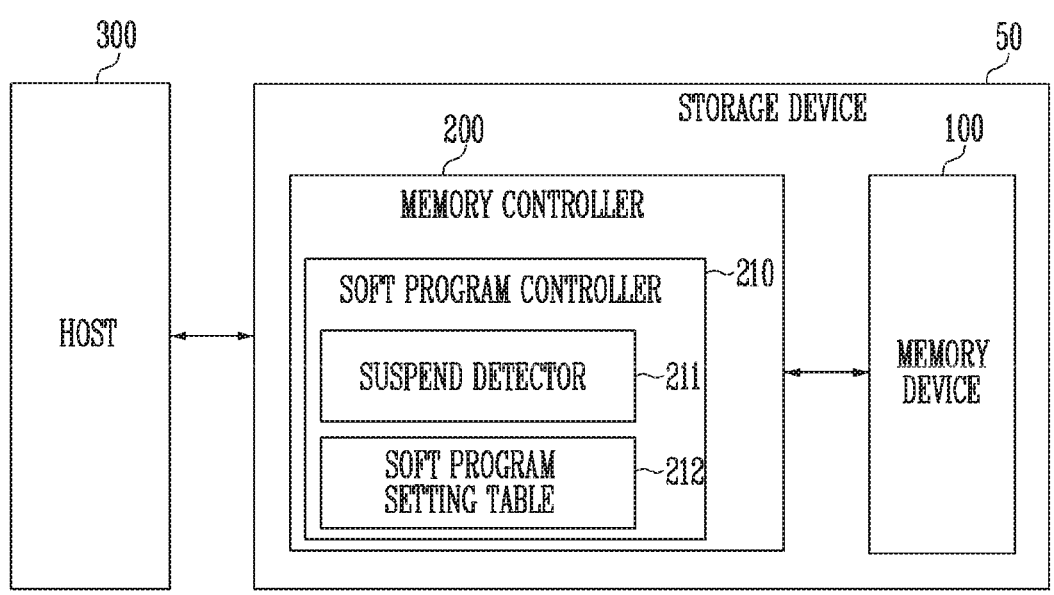
FIG. 1 is a diagram illustrating an example of a storage device based on an embodiment of the disclosed technology.

The technology disclosed in this patent document can be implemented in embodiments to provide a storage device that can reduce/minimize a potential over-erase phenomenon.

The present disclosure will not be described in detail based on embodiments. The present disclosure may, however, be embodied in many different forms and should not be construed as being limited to only the embodiments set forth herein, but should be construed as covering modifications, equivalents or alternatives falling within ideas and technical scopes of the present disclosure. However, this is not intended to limit the present disclosure to particular modes of practice, and it is to be appreciated that all changes, equivalents, and substitutes that do not depart from the spirit and technical scope of the present disclosure are encompassed in the present disclosure.

It will be understood that, although the terms "first" and/or "second" may be used herein to describe various elements, these elements should not be limited by these terms. These terms are only used to distinguish one element, from another element. For instance, a first element discussed below could be termed a second element without departing from the teachings of the present disclosure. Similarly, the second element could also be termed the first element.

It will be understood that when an element is referred to as being "coupled" or "connected" to another element, it can be directly coupled or connected to the other element or intervening elements may be present therebetween. In contrast, it should be understood that when an element is referred to as being "directly coupled" or "directly connected" to another element, there are no intervening elements present. Other expressions that explain the relationship between elements, such as "between", "directly between", "adjacent to" or "directly adjacent to" should be construed in the same way.

The terminology used herein is for the purpose of describing particular embodiments only and is not intended to be limiting. In the present disclosure, the singular forms are intended to include the plural forms as well, unless the context clearly indicates otherwise. It will be further understood that the terms "comprise", "include", "have", etc. when used in this specification, specify the presence of stated features, integers, steps, operations, elements, components, and/or combinations of them but do not preclude the presence or addition of one or more other features, integers, steps, operations, elements, components, and/or combinations thereof.

Unless otherwise defined, all terms including technical and scientific terms used herein have the same meaning as commonly understood by one of ordinary skill in the art to which the present disclosure belongs. It will be further understood that terms used herein should be interpreted as having a meaning that is consistent with their meaning in the context of this specification and the relevant art and will not be interpreted in an idealized or overly formal sense unless expressly so defined herein.

Detailed description of functions and structures well known to those skilled in the art will be omitted to avoid obscuring the subject matter of the present disclosure. This aims to omit unnecessary description so as to make the subject matter of the present disclosure clear.

Various embodiments of the present disclosure will now be described more fully hereinafter with reference to the accompanying drawings, in which preferred embodiments of the present disclosure are illustrated, so that those of ordinary skill in the art can easily carry out the technical idea of the present disclosure.

FIG. 1 is a diagram illustrating an example of a storage device based on an embodiment of the disclosed technology.

Referring to FIG. 1, a storage device 50 may include a memory device 100 and a memory controller 200. The storage device 50 may be a device that is used by a host 300, such as a mobile phone, a smartphone, an MP3 player, a laptop computer, a desktop computer, a game console, a television (TV), a tablet personal computer (PC), or an in-vehicle infotainment system, to retain data files of the host 300.

The storage device 50 may be manufactured as any one of various types of storage devices depending on a host interface between the host 300 and its peripheral devices. The storage device 50 may be implemented as any one of various types of storage devices, for example, a solid state drive (SSD), a multimedia card such as an MMC, an embedded MMC (eMMC), a reduced size MMC (RS-MMC), or a micro-MMC, a secure digital card such as an SD, a mini-SD, or a micro-SD, a universal storage bus (USB) storage device, a universal flash storage (UFS) device, a personal computer memory card international association (PCMCIA) card-type storage device, a peripheral component interconnection (PCI)-card type storage device, a PCI express (PCI-E) card-type storage device, a compact flash (CF) card, a smart media card, and a memory stick.

The storage device 50 may be manufactured in any one of various types of package forms. For example, the storage device 50 may be manufactured in any one of various types of package forms, such as package on package (POP), system in package (SIP), system on chip (SOC), multi-chip package (MCP), chip on board (COB), wafer-level fabricated package (WFP), and wafer-level stack package (WSP).

The memory device 100 may store data. The memory device 100 is operated in response to the control of the memory controller 200. The memory device 100 may include a memory cell array including a plurality of memory cells which store data. The memory cell array may include a plurality of memory blocks. Each memory block may include a plurality of memory cells. A single memory block may include a plurality of pages. In an embodiment, each page may be a unit by which data is stored in the memory device 100 or by which data stored in the memory device 100 is read. A memory block may be a unit by which data is erased. In an embodiment, the memory device 100 may take many alternative forms, such as a double data rate synchronous dynamic random access memory (DDR SDRAM), a low power double data rate fourth generation (LPDDR4) SDRAM, a graphics double data rate (GDDR) SDRAM, a low power DDR (LPDDR) SDRAM, a Rambus dynamic random access memory (RDRAM), a NAND flash memory, a vertical NAND flash memory, a NOR flash memory device, a resistive RAM (RRAM), a phase-change memory (PRAM), a magnetoresistive RAM (MRAM), a ferroelectric RAM (FRAM), or a spin transfer torque RAM (STT-RAM). In the present specification, for convenience of description, a description will be made on the assumption that the memory device 100 is a NAND flash memory.

The memory device 100 may receive a command and an address from the memory controller 200, and may access the area of the memory cell array, selected by the address. That is, the memory device 100 may perform an operation corresponding to the command on the area selected by the address. For example, the memory device 100 may perform a write operation (i.e., program operation), a read operation, and an erase operation. During a program operation, the memory device 100 may program data to the area selected by the address. During a read operation, the memory device 100 may read data from the area selected by the address. During an erase operation, the memory device 100 may erase data stored in the area selected by the address.

The memory controller 200 controls the overall operation of the storage device 50.

When power is applied to the storage device 50, the memory controller 200 may run firmware (FW). When the memory device 100 is a flash memory device, the memory controller 200 may run firmware such as a Flash Translation Layer (FTL) for controlling communication between the host 300 and the memory device 100, including address mapping, wear leveling, bad block remapping, and error correction.

In an embodiment, the memory controller 200 may receive data and a logical block address (LBA) from the host 300, and may translate the logical block address (LBA) into a physical block address (PBA) indicating the address of memory cells which are included in the memory device 100 and in which data is to be stored. For example, in an implementation where the memory device 100 includes one or more NAND flash memory devices, the memory controller 200 may can read data or write data from or to the memory device 100 on a page basis, and can erase data on a block basis. The memory controller 200 may map the LBA to the PBA by translating logical block and page addresses into physical block and page addresses where the data will actually be written.

In some embodiments of the disclosed technology, the memory controller 200 may control the memory device 100 so that a program operation, a read operation or an erase operation is performed in response to a request received from the host 300. During a program operation, the memory controller 200 may write data in the memory device 100 based on a physical block address (PBA). During a read operation, the memory controller 200 may read data from the memory device 100 based on a physical block address (PBA). During an erase operation, the memory controller 200 may perform an erase operation based on a physical block address (PBA).

In an embodiment, the memory controller 200 may autonomously generate a program command, an address, and data without receiving a request from the host 300, and may transmit them to the memory device 100. For example, the memory controller 200 may provide commands, addresses, and data to the memory device 100 so as to perform background operations, such as wear leveling and garbage collection.

In an embodiment, the memory controller 200 may control two or more memory devices 100. In this case, the memory controller 200 may control the memory devices 100 in an interleaved manner to improve operating performance.

The host 300 may communicate with the storage device 50 using at least one of various communication methods such as Universal Serial Bus (USB), Serial AT Attachment (SATA), Serial Attached SCSI (SAS), High Speed Interchip (HSIC), Small Computer System Interface (SCSI), Peripheral Component Interconnection (PCI), PCI express (PCIe), Nonvolatile Memory express (NVMe), Universal Flash Storage (UFS), Secure Digital (SD), MultiMedia Card (MMC), embedded MMC (eMMC), Dual In-line Memory Module (DIMM), Registered DIMM (RDIMM), and Load Reduced DIMM (LRDIMM) communication methods.

When a request for an erase operation on a memory block is received from the host 300, the memory controller 200 may provide an erase command to the memory device 100. Upon receipt of the erase command, the memory device 100 may perform an erase operation on an erase target memory block requested to be erased. After the erase operation has been performed, the memory controller 200 may perform a soft program operation on the erased memory block of the memory device 100 to raise threshold voltages of memory cells of the erased memory block to a desired threshold voltage level.

In a situation where users (e.g., host 300) request certain operations during other operations, some memory controllers require access to memory cells before those other operation complete. For example, an erase suspend feature allows the user to interrupt erase or program operation in order to read data from the memory block. In an implementation, the memory controller 200 may provide a suspend command to the memory device 100 in the middle of an erase operation, and upon receipt of the suspend command, the memory device 100 may suspend the erase operation.

Upon receipt of a command for performing another operation in the middle of an erase operation, the memory controller 200 may interrupt the erase operation to perform the another operation first and resume the suspended erase operation after the another operation completes. For example, the memory controller 200 may provide another erase command for the erase target memory block to resume the erase operation. Alternatively, the memory controller 200 may provide a resume command to the memory device 100 to resume the erase operation.

In an embodiment, the memory controller 200 may include a soft program controller 210. The soft program controller 210 may include a suspend detector 211 and a soft program setting table 212.

The soft program controller 210 may set a soft program voltage to be used for a soft program operation based on the number of erase suspend/resume cycles until the erase operation is completed. The soft program controller 210 may instruct the memory device 100 to perform a soft program operation using the set soft program voltage by issuing a soft program command. The soft program operation may be performed to raise threshold voltages of memory cells of the erased memory block to a desired threshold voltage level. For example, during the soft program operation, program pulses are applied to erased memory cells to shift the threshold voltages of the memory cells included in the erase target memory block to a set threshold voltage distribution.

The soft program controller 210 may provide a set parameter command for setting the soft program voltage when providing the soft program command to the memory device 100.

The suspend detector 211 may count the number of erase suspend/resume cycles. In some implementations, the number of erase suspend/resume cycles may be determined based on the number of suspend commands that are provided by the memory controller 200 to the memory device 100.

In an embodiment, the soft program setting table 212 may store soft program setting information that indicates soft program operating conditions depending on the number of erase suspend/resume cycles. The soft program operating conditions may include at least one of a soft program start bias, a soft program pulse count, and a soft program pulse bias.

In an embodiment, the soft program setting table 212 may include soft program setting information that indicates soft program operating conditions depending on the level of a hard erase verify (HEV) voltage. The HEV voltage may be a read voltage for determining the threshold voltage distribution of memory cells included in the erased memory block.

Figure 2:
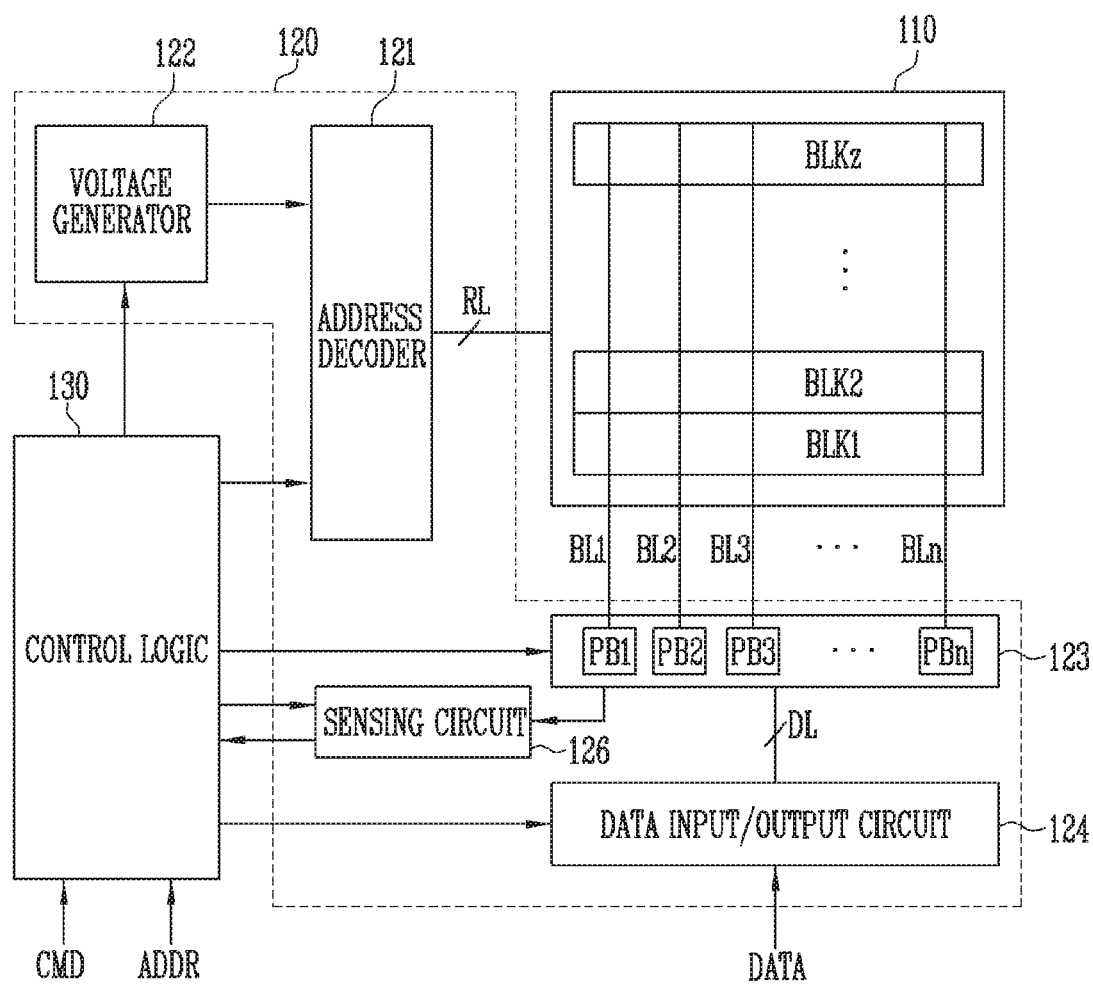
FIG. 2 is a diagram illustrating an example structure of a memory device of FIG. 1.

FIG. 2 is a diagram illustrating an example structure of the memory device of FIG. 1.

Referring to FIG. 2, the memory device 100 may include a memory cell array 110, a peripheral circuit 120, and a control logic 130.

The memory cell array 110 includes a plurality of memory blocks BLK1 to BLKz. The plurality of memory blocks BLK1 to BLKz are coupled to an address decoder 121 through row lines RL. The memory blocks BLK1 to BLKz are coupled to a read and write circuit 123 through bit lines BL1 to BLn. Each of the memory blocks BLK1 to BLKz includes a plurality of memory cells. In an embodiment, the plurality of memory cells are nonvolatile memory cells. In the plurality of memory cells, memory cells coupled to the same word line are defined as a single page. That is, the memory cell array 110 is composed of a plurality of pages. In an embodiment of the disclosed technology, each of the plurality of memory blocks BLK1 to BLKz included in the memory cell array 110 may include a plurality of dummy cells to reduce the effect of an electric field between memory cells and select transistors. As an example, one or more dummy cells may be coupled in series between a drain select transistor and the memory cells and between a source select transistor and the memory cells.

Each of the memory cells of the memory device 100 may be implemented as a single-level cell (SLC) capable of storing a single data bit per memory cell, a multi-level cell (MLC) capable of storing two data bits per memory cell, a triple-level cell (TLC) capable of storing three data bits per memory cell, or a quad-level cell (QLC) capable of storing four data bits per memory cell.

The peripheral circuit 120 may include the address decoder 121, a voltage generator 122, the read and write circuit 123, and a data input/output circuit 124.

The peripheral circuit 120 may drive the memory cell array 110. For example, the peripheral circuit 120 may drive the memory cell array 110 so that a program operation, a read operation, and an erase operation are performed.

The address decoder 121 is coupled to the memory cell array 110 through row lines RL. The row lines RL may include drain select lines, word lines, source select lines, and a common source line. In accordance with an embodiment of the present disclosure, the word lines may include normal word lines and dummy word lines. In accordance with an embodiment of the present disclosure, the row lines RL may further include a pipe select line.

The address decoder 121 may be operated under the control of the control logic 130. The address decoder 121 receives addresses ADDR from the control logic 130.

The address decoder 121 may decode the received addresses ADDR to identify a block address to be accessed, and may select at least one memory block from among the memory blocks BLK1 to BLKz based on the block address. The address decoder 121 is configured to decode the received addresses ADDR to identify a row address to be accessed, and may select at least one word line of the selected memory block by applying voltages supplied from the voltage generator 122 to at least one word line WL based on the row address.

In an implementation where the memory cell array 110 includes NAND flash memories, a plurality of memory cell transistors is connected in series to form a memory cell string. Each cell string is coupled to a bit line, and word lines are coupled to memory cell transistors of each memory cell string in parallel. Read voltages, which are used as a reference voltage for read operations, and program voltages, which are used to program memory cells, are applied to a word line such that all the memory cells electrically connected to the word line are read or programmed simultaneously. In addition, program verify voltages, which are used to read memory cells to see whether the memory cell has reached a target threshold voltage, are applied to the word line at every application of program voltage. In the NAND flash memory architecture, memory cells can be read and programmed on a page basis, but can be erased at the level of the entire block consisting of pages.

During a program operation, the address decoder 121 may apply a program voltage to the selected word line and apply a pass voltage having a level lower than that of the program voltage to unselected word lines. During a program verify operation, the address decoder 121 may apply a verify voltage to a selected word line and apply a verify pass voltage higher than the verify voltage to unselected word lines.

During a read operation, the address decoder 121 may apply a read voltage to a selected word line and apply a read pass voltage higher than the read voltage to unselected word lines.

In an embodiment of the disclosed technology, the erase operation of the memory device 100 may be performed on a memory block basis. During an erase operation, the addresses ADDR input to the memory device 100 include a block address. The address decoder 121 may decode the addresses ADDR to identify the block address and select a single memory block in response to the decoded block address. During the erase operation, the address decoder 121 may apply a ground voltage to word lines coupled to the selected memory block.

In an embodiment of the disclosed technology, the address decoder 121 may decode the received addresses ADDR to identify a column address. The decoded column address may be transferred to the read and write circuit 123. In an embodiment, the address decoder 121 may include components such as a row decoder, a column decoder, and an address buffer.

The voltage generator 122 may generate a plurality of voltages using an external supply voltage that is supplied to the memory device 100. The voltage generator 122 may be operated under the control of the control logic 130.

In an embodiment, the voltage generator 122 may generate an internal supply voltage by regulating the external supply voltage. The internal supply voltage generated by the voltage generator 122 is used as an operating voltage for the memory device 100.

In an embodiment, the voltage generator 122 may generate a plurality of voltages using the external supply voltage or the internal supply voltage. The voltage generator 122 may generate various voltages required by the memory device 100. For example, the voltage generator 122 may generate a plurality of erase voltages, a plurality of program voltages, a plurality of pass voltages, a plurality of select read voltages, and a plurality of unselect read voltages.

The voltage generator 122 may include a plurality of pumping capacitors that receive the internal supply voltage and generate a plurality of voltages having various voltage levels, and may generate a plurality of voltages by selectively enabling the plurality of pumping capacitors under the control of the control logic 130.

The generated voltages may be supplied to the memory cell array 110 by the address decoder 121.

The read and write circuit 123 includes first to n-th page buffers PB1 to PBn. The first to n-th page buffers PB1 to PBn are coupled to the memory cell array 110 through the first to n-th bit lines BL1 to BLn, respectively. The first to n-th page buffers PB1 to PBn may be operated under the control of the control logic 130.

The first to n-th page buffers PB1 to PBn may perform data communication with the data input/output circuit 124. During a program operation, the first to n-th page buffers PB1 to PBn receive data DATA to be stored through the data input/output circuit 124 and data lines DL.

During a program operation, the first to n-th page buffers PB1 to PBn may transfer the data DATA to be stored, received through the data input/output circuit 124, to selected memory cells through the bit lines BL1 to BLn when a program pulse is applied to a selected word line. The memory cells in the selected page are programmed based on the received data DATA. Memory cells coupled to a bit line to which a program permission voltage (e.g., a ground voltage) is applied may have increased threshold voltages as a result of the application of the program voltage pulse. The threshold voltages of memory cells coupled to a bit line to which a program inhibit voltage (e.g., a supply voltage) is applied may be left unchanged due to the program inhibit voltage. During a program verify operation, the first to n-th page buffers PB1 to PBn may read data stored in selected memory cells from the selected memory cells through the bit lines BL1 to BLn.

During a read operation, the read and write circuit 123 may read data DATA from the memory cells in the selected page through the bit lines BL, and may temporarily store the read data DATA in the first to n-th page buffers PB1 to PBn.

During an erase operation, the read and write circuit 123 may allow the bit lines BL to float. In an embodiment, the read and write circuit 123 may include a column select circuit.

The data input/output circuit 124 is coupled to the first to n-th page buffers PB1 to PBn through the data lines DL. The data input/output circuit 124 is operated in response to the control of the control logic 130.

The data input/output circuit 124 may include a plurality of input/output buffers (not illustrated) which receive input data. During a program operation, the data input/output circuit 124 receives the data DATA to be stored from an external controller (not illustrated). During a read operation, the data input/output circuit 124 outputs the data, received from the first to n-th page buffers PB1 to PBn included in the read and write circuit 123, to the external controller.

During a read operation or a verify operation, the sensing circuit 126 may generate a reference current in response to an enable bit signal generated by the control logic 130, and may output a "pass" signal or a "fail" signal to the control logic 130 by comparing a sensing voltage received from the read and write circuit 123 with a reference voltage generated by the reference current. The "pass" signal indicates that a threshold voltage of a target memory cell has reached a target threshold voltage, and the "fail" signal indicates that the threshold voltage of the target memory cell has not reached the target threshold voltage yet.

The control logic 130 may be coupled to the address decoder 121, the voltage generator 122, the read and write circuit 123, the data input/output circuit 124, and the sensing circuit 126. The control logic 130 may control the overall operation of the memory device 100. The control logic 130 may be operated in response to a command CMD transmitted from an external device.

The control circuit 130 may control the peripheral circuit 120 by generating various types of signals in response to the command CMD and the addresses ADDR. For example, the control logic 130 may generate an operation signal, a row address, a read and write circuit control signal, and an enable bit in response to the command CMD and the addresses ADDR. The control logic 130 may output the operation signal to the voltage generator 122, output the row address to the address decoder 121, output the read and write circuit control signal to the read and write circuit 123, and output the enable bit to the sensing circuit 126. Further, the control logic 130 may determine whether the target memory cell has passed or failed the verification based on the "pass" or "fail" signal output from the sensing circuit 126.

Figure 3:
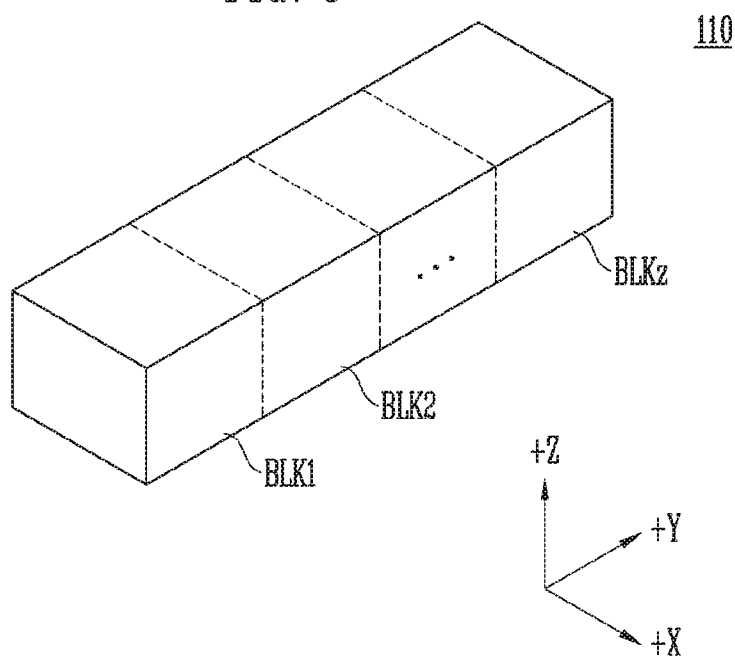
FIG. 3 is a diagram illustrating an example of a memory cell array of FIG. 2.

FIG. 3 is a diagram illustrating an example of the memory cell array of FIG. 2.

Referring to FIG. 3, the memory cell array 110 includes a plurality of memory blocks BLK1 to BLKz. Each memory block may have a three-dimensional (3D) structure. Each memory block includes a plurality of memory cells stacked on a substrate. Such memory cells are arranged in a positive X (+X) direction, a positive Y (+Y) direction, and a positive Z (+Z) direction. The structure of each memory block will be described in detail below with reference to FIGS. 4 and 5.

Figure 4:
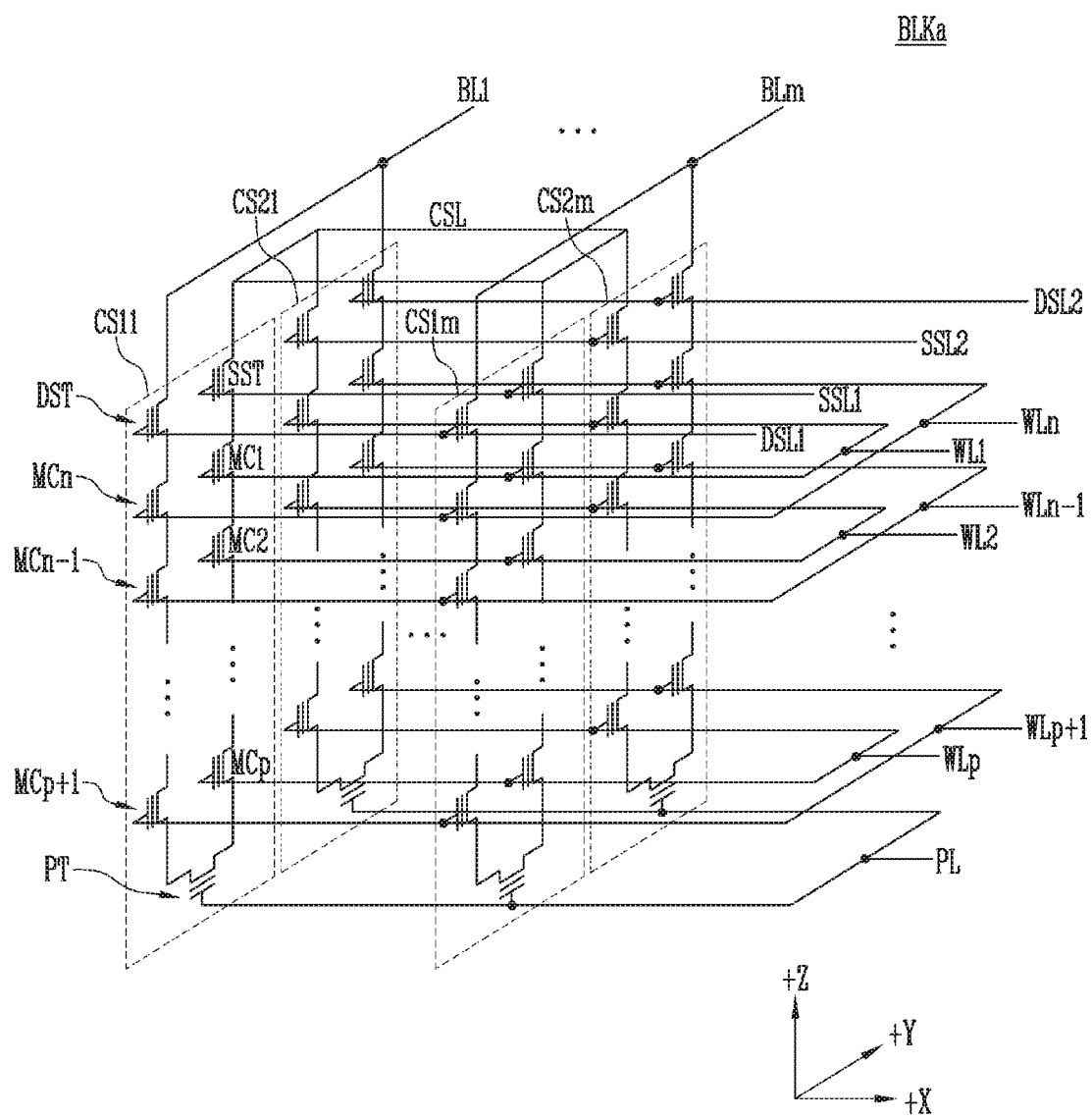
FIG. 4 is a circuit diagram illustrating one memory block BLKa of memory blocks BLK1 to BLKz of FIG. 3.

FIG. 4 is a circuit diagram illustrating one memory block BLKa of the memory blocks BLK1 to BLKz of FIG. 3.

Referring to FIG. 4, the memory block BLKa includes a plurality of cell strings CS11 to CS1$m$ and CS21 to CS2$m$. Each cell string consists of a plurality of memory cells and other transistors coupled in series in a column direction as shown in the drawings. In an embodiment, each of the cell strings CS11 to CS1$m$ and CS21 to CS2$m$ may be formed in a 'U' shape. In the memory block BLKa, m cell strings are arranged in a row direction (i.e. a positive (+) X direction). In FIG. 4, two cell strings are illustrated as being arranged in a column direction (i.e. a positive (+) Y direction). However, this illustration is offered for explanatory purposes only, and thus it will be understood that three or more cell strings may be arranged in the column direction.

Each of the plurality of cell strings CS11 to CS1$m$ and CS21 to CS2$m$ includes at least one source select transistor SST, first to n-th memory cells MC1 to MCn, a pipe transistor PT, and at least one drain select transistor DST.

The select transistors SST and DST and the memory cells MC1 to MCn may have similar structures, respectively. In an embodiment, each of the select transistors SST and DST and the memory cells MC1 to MCn may include a channel layer, a tunneling insulating layer, a charge storage layer, and a blocking insulating layer. In an embodiment, a pillar for providing the channel layer may be provided to each cell string. In an embodiment, a pillar for providing at least one of the channel layer, the tunneling insulating layer, the charge storage layer, and the blocking insulating layer may be provided to each cell string.

The source select transistor SST of each cell string is connected between the common source line CSL and memory cells MC1 to MCp.

In an embodiment, the source select transistors of cell strings arranged in the same row are coupled to a source select line extending in a row direction, and source select transistors of cell strings arranged in different rows are coupled to different source select lines. In FIG. 4, source select transistors of cell strings CS11 to CS1$m$ in a first row are coupled to a first source select line SSL1. The source select transistors of cell strings CS21 to CS2$m$ in a second row are coupled to a second source select line SSL2.

In an embodiment, source select transistors of the cell strings CS11 to CS1$m$ and CS21 to CS2$m$ may be coupled in common to a single source select line.

The first to n-th memory cells MC1 to MCn in each cell string are coupled between the source select transistor SST and the drain select transistor DST.

The first to n-th memory cells MC1 to MCn may be divided into first to p-th memory cells MC1 to MCp and p+1-th to n-th memory cells MCp+1 to MCn. The first to p-th memory cells MC1 to MCp are sequentially arranged in a direction opposite a positive (+) Z direction and are connected in series between the source select transistor SST and the pipe transistor PT. The p+1-th to n-th memory cells MCp+1 to MCn are sequentially arranged in the +Z direction and are connected in series between the pipe transistor PT and the drain select transistor DST. The first to p-th memory cells MC1 to MCp and the p+1-th to n-th memory cells MCp+1 to MCn are coupled to each other through the pipe transistor PT. The gates of the first to n-th memory cells MC1 to MCn of each cell string are coupled to first to n-th word lines WL1 to WLn, respectively.

A gate of the pipe transistor PT of each cell string is coupled to a pipeline PL.

The drain select transistor DST of each cell string is coupled between the corresponding bit line and the memory cells MCp+1 to MCn. The cell strings in a row direction are coupled to drain select lines extending in a row direction. Drain select transistors of cell strings CS11 to CS1$m$ in the first row are coupled to a first drain select line DSL1. Drain select transistors of cell strings CS21 to CS2$m$ in a second row are coupled to a second drain select line DSL2.

Cell strings arranged in a column direction are coupled to bit lines extending in a column direction. In FIG. 4, cell strings CS11 and CS21 in a first column are coupled to a first bit line BL1. Cell strings CS1$m$ and CS2$m$ in an m-th column are coupled to an m-th bit line BL$m$.

The memory cells coupled to the same word line in cell strings arranged in a row direction constitute a single page. For example, memory cells coupled to the first word line WL1, among the cell strings CS11 to CS1$m$ in the first row, constitute a single page. Memory cells coupled to the first word line WL1, among the cell strings CS21 to CS2$m$ in the second row, constitute a single additional page. Cell strings arranged in the direction of a single row may be selected by selecting any one of the drain select lines DSL1 and DSL2. A single page may be selected from the selected cell strings by selecting any one of the word lines WL1 to WLn.

In an embodiment, even-numbered bit lines and odd-numbered bit lines, instead of first to m-th bit lines BL1 to BLm, may be provided. Further, even-numbered cell strings, among the cell strings CS11 to CS1m or CS21 to CS2m arranged in a row direction, may be coupled to the even-numbered bit lines, respectively, and odd-numbered cell strings, among the cell strings CS11 to CS1m or CS21 to CS2m arranged in the row direction, may be coupled to the odd-numbered bit lines, respectively.

In an embodiment, one or more of the first to n-th memory cells MC1 to MCn may be used as dummy memory cells. For example, one or more dummy memory cells are provided to reduce an electric field between the source select transistor SST and the memory cells MC1 to MCp. Alternatively, the one or more dummy memory cells are provided to reduce an electric field between the drain select transistor DST and the memory cells MCp+1 to MCn. As more dummy memory cells are provided, the reliability of the operation of the memory block BLKa is improved, but the size of the memory block BLKa is increased. As fewer memory cells are provided, the size of the memory block BLKa is reduced, but the reliability of the operation of the memory block BLKa may be deteriorated.

In order to efficiently control the one or more dummy memory cells, each of the dummy memory cells may have a required threshold voltage. Before or after the erase operation of the memory block BLKa is performed, a program operation may be performed on all or some of the dummy memory cells. When an erase operation is performed after the program operation has been performed, the threshold voltages of the dummy memory cells control the voltages that are applied to the dummy word lines coupled to respective dummy memory cells, and thus the dummy memory cells may have threshold voltages required for an efficient control of the dummy memory cells.

Figure 5:
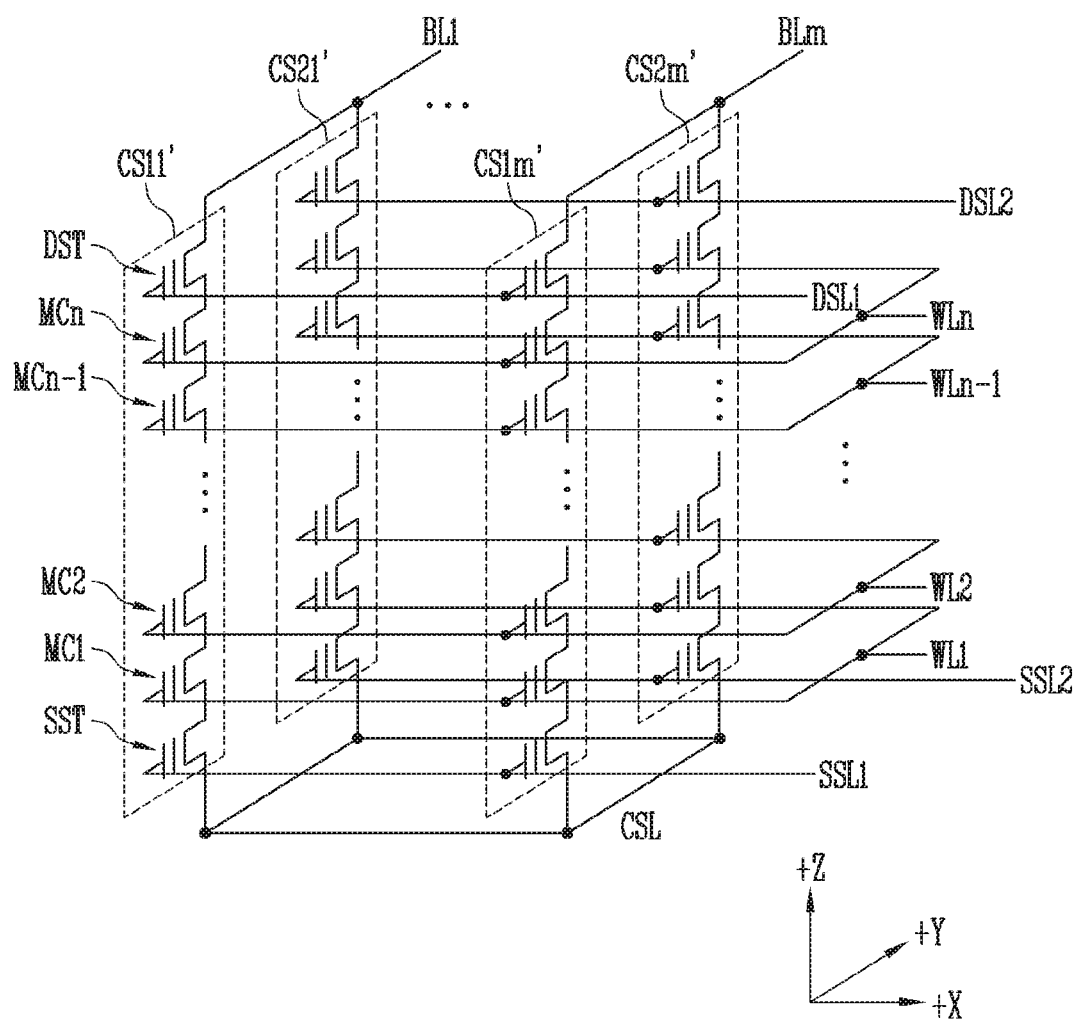
FIG. 5 is a circuit diagram illustrating an example of one memory block BLKb of the memory blocks BLK1 to BLKz of FIG. 3.

FIG. 5 is a circuit diagram illustrating an example of one memory block BLKb of the memory blocks BLK1 to BLKz of FIG. 3.

Referring to FIG. 5, the memory block BLKb includes a plurality of cell strings CS11' to CS1m' and CS21' to CS2m'. Each of the plurality of cell strings CS11' to CS1m' and CS21' to CS2m' extends in a positive Z (+Z) direction. Each of the cell strings CS11' to CS1m' and CS21' to CS2m' includes at least one source select transistor SST, first to n-th memory cells MC1 to MCn, and at least one drain select transistor DST, which are stacked on a substrate (not illustrated) below the memory block BLKb.

The source select transistor SST of each cell string is connected between a common source line CSL and memory cells MC1 to MCn. The source select transistors of cell strings arranged in the same row are coupled to the same source select line. Source select transistors of cell strings CS11' to CS1m' arranged in a first row are coupled to a first source select line SSL1. Source select transistors of cell strings CS21' to CS2m' arranged in a second row are coupled to a second source select line SSL2. In an embodiment, source select transistors of the cell strings CS11' to CS1m' and CS21' to CS2m' may be coupled in common to a single source select line.

The first to n-th memory cells MC1 to MCn in each cell string are connected in series between the source select transistor SST and the drain select transistor DST. The gates of the first to n-th memory cells MC1 to MCn are coupled to first to n-th word lines WL1 to WLn, respectively.

The drain select transistor DST of each cell string is connected between the corresponding bit line and the memory cells MC1 to MCn. Drain select transistors of cell strings arranged in a row direction are coupled to drain select lines extending in a row direction. The drain select transistors of the cell strings CS11' to CS1m' in the first row are coupled to a first drain select line DSL1. The drain select transistors of the cell strings CS21' to CS2m' in the second row are coupled to a second drain select line DSL2.

As a result, the memory block BLKb of FIG. 5 has an equivalent circuit similar to that of the memory block BLKa of FIG. 4 except that a pipe transistor PT is excluded from each cell string.

In an embodiment, even-numbered bit lines and odd-numbered bit lines, instead of first to m-th bit lines BL1 to BLm, may be provided. Further, even-numbered cell strings, among the cell strings CS11' to CS1m' or CS21' to CS2m' arranged in a row direction, may be coupled to the even-numbered bit lines, respectively, and odd-numbered cell strings, among the cell strings CS11' to CS1m' or CS21' to CS2m' arranged in the row direction, may be coupled to the odd-numbered bit lines, respectively.

In an embodiment, one or more of the first to n-th memory cells MC1 to MCn may be used as dummy memory cells. For example, the one or more dummy memory cells are provided to reduce an electric field between the source select transistor SST and the memory cells MC1 to MCn. Alternatively, the one or more dummy memory cells are provided to reduce an electric field between the drain select transistor DST and the memory cells MC1 to MCn. These dummy memory cells can be used to improve the reliability of the operation of the memory block BLKb, but they can negatively impact on the size of the memory block BLKb is increased.

In order to efficiently control the one or more dummy memory cells, each of the dummy memory cells may have a required threshold voltage. Before or after the erase operation of the memory block BLKb is performed, a program operation may be performed on all or some of the dummy memory cells. When an erase operation is performed after the program operation has been performed, the threshold voltages of the dummy memory cells control the voltages that are applied to the dummy word lines coupled to respective dummy memory cells, and thus the dummy memory cells may have the threshold voltages required for an efficient control of the dummy memory cells.

Figure 6:
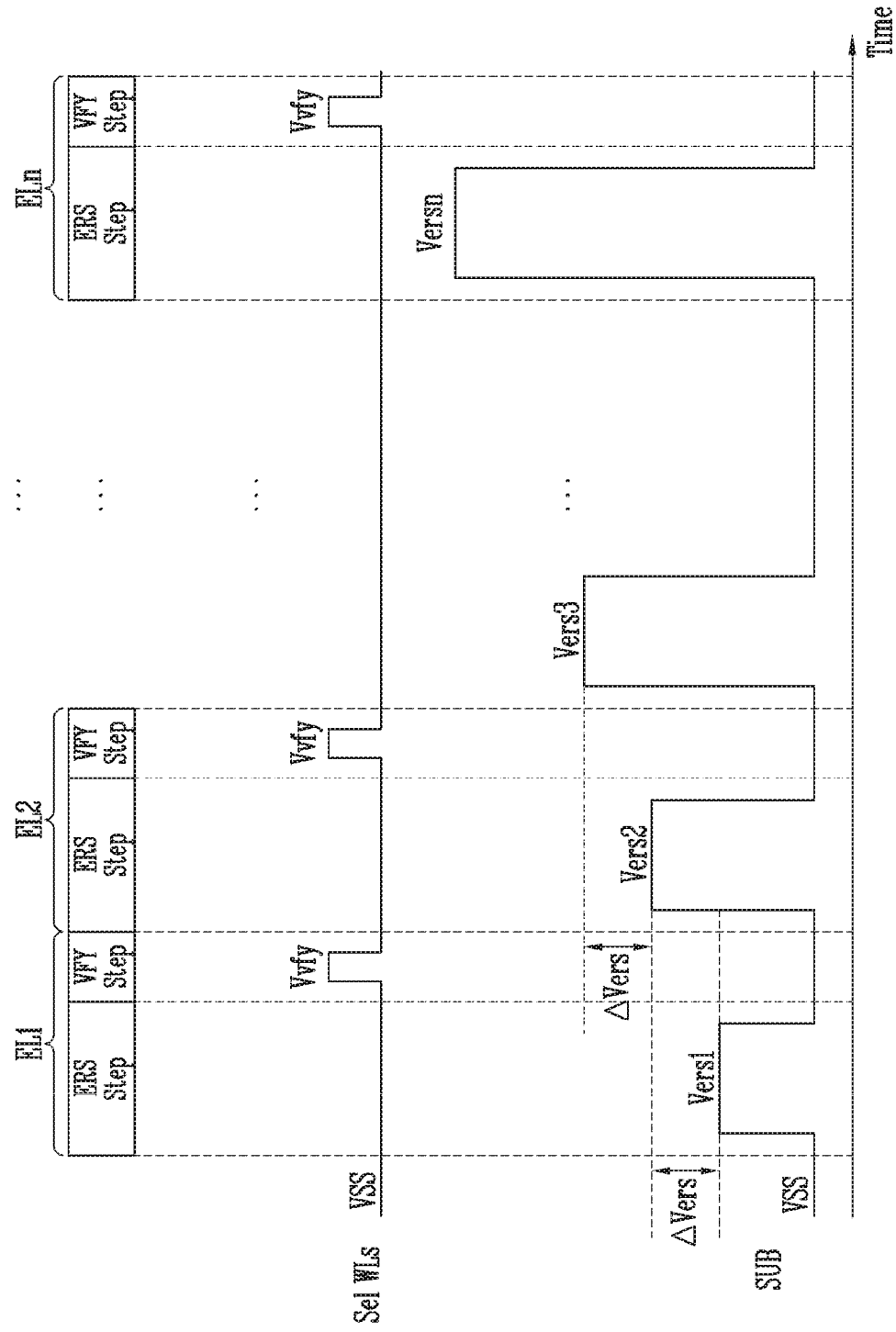
FIG. 6 is a diagram illustrating an example of an erase operation of a memory block.

FIG. 6 is a diagram illustrating an example of an erase operation of a memory block.

Referring to FIG. 6, the erase operation may include first to n-th erase loops EL1 to ELn (where n is a positive integer of 1 or more). Each erase loop may include an erase (ERS) step and a verify (VFY) step.

At the ERS step, an erase voltage Vers may be applied to channel regions of a plurality of memory cell strings included in the memory block. For example, the erase voltage Vers may be applied to a substrate SUB including the channel regions. A ground voltage VSS may be applied to word lines coupled to the memory block while the erase voltage Vers is being applied.

At the VFY step, the memory device may determine whether memory cells included in the memory block have threshold voltages corresponding to an erased state. For example, at the VFY step, an erase verify voltage Vvfy may be applied to the word lines coupled to the memory block. Depending on whether the threshold voltages of the memory cells are lower than the erase verify voltage Vvfy, the memory cells may be determined to be "ON" cells or "OFF" cells. In some implementations, the "ON" cell indicates a memory cell in an erase state, and the "OFF" cell indicates a memory cell in a program state.

For example, when the threshold voltages of the memory cells are lower than the erase verify voltage Vvfy, the memory cells may be determined to be "ON" cells. When the threshold voltages of the memory cells are equal to or higher than the erase verify voltage Vvfy, the memory cells may be determined to be "OFF" cells. At the VFY Step, when the number of memory cells having threshold voltages lower than the erase verify voltage Vvfy exceeds the preset number of memory cells, it can be determined that the erase operation has been completed. When the number of memory cells having threshold voltages lower than the erase verify voltage Vvfy is less than or equal to the preset number of memory cells, it can be determined that the erase operation has not been completed, and the erase loops EL may be repeated until completion of the erase operation.

Whenever an erase loop EL is repeated, the level of the erase voltage Vers may be increased by a step voltage ΔVers (Incremental Step Pulse Erase: ISPE). For example, the level of the erase voltage Vers2 of the second erase loop EL2 is higher than the erase voltage Vers1 of the first erase loop EL1 by the step voltage ΔVers, and the level of the erase voltage Vers3 of the third erase loop EL3 is higher than the erase voltage Vers2 of the second erase loop EL2 by the step voltage ΔVers. Similarly, the level of the erase voltage Versn of the n-th erase loop ELn may be higher than the erase voltage Vers(n−1) of the (n−1)-th erase loop EL(n−1) by the step voltage ΔVers.

In an embodiment, at the ERS step of the first erase loop EL1, the erase voltage Vers1 may be applied to channel regions of a plurality of memory cell strings included in the memory block. For example, the erase voltage Vers1 may be applied to the substrate SUB including the channel regions. The ground voltage VSS may be applied to word lines coupled to the memory block while the erase voltage Vers1 is being applied. At each erase (ERS) step, the verify (VFY) step may be performed.

In detail, at the VFY step of the first erase loop EL1, the erase verify voltage Vvfy may be applied to the word lines coupled to the memory block. When the erase operation has passed the verification at the VFY step, the erase operation may be terminated. When the erase operation has failed the verification at the VFY step, the second erase loop EL2 may be performed. The second erase loop EL2 may also be performed in a manner similar to that of the first erase loop ELL Until the erase operation passes, the second to n-th erase loops EL2 to ELn may be performed.

Figure 7:
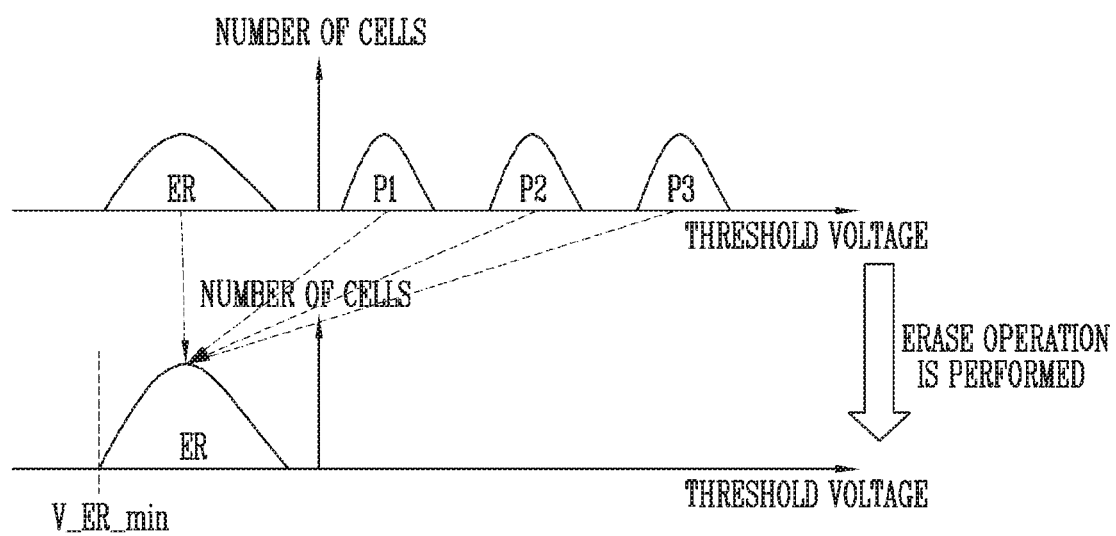
FIG. 7 is a diagram illustrating an example of a threshold voltage distribution depending on an erase operation.

FIG. 7 is a diagram illustrating an example of a threshold voltage distribution depending on an erase operation.

Referring to FIG. 7, a horizontal axis denotes a threshold voltage and a vertical axis denotes the number of memory cells.

Each of the memory cells may be implemented as a single-level cell (SLC) capable of storing a single data bit per memory cell, a multi-level cell (MLC) capable of storing two data bits per memory cell, a triple-level cell (TLC) capable of storing three data bits per memory cell, or a quad-level cell (QLC) capable of storing four data bits per memory cell. In this patent document, for purpose of illustrative example, it is assumed that each memory cell is a multi-level cell for storing two data bits.

Each of the memory cells may be identified as being in a state corresponding to any one of an erased state ER, a first programmed state P1, a second programmed state P2, and a third programmed state P3 depending on the magnitude of the threshold voltage thereof. As a result of a program operation, some of the memory cells stay at the erased state ER and the others of the memory cells may be programmed to have any one of the first programmed state P1, the second programmed state P2, and the third programmed state P3. When the erase operation is performed, all the memory cells in the corresponding memory block may be erased to have threshold voltages corresponding to the erased state ER.

Figure 8:
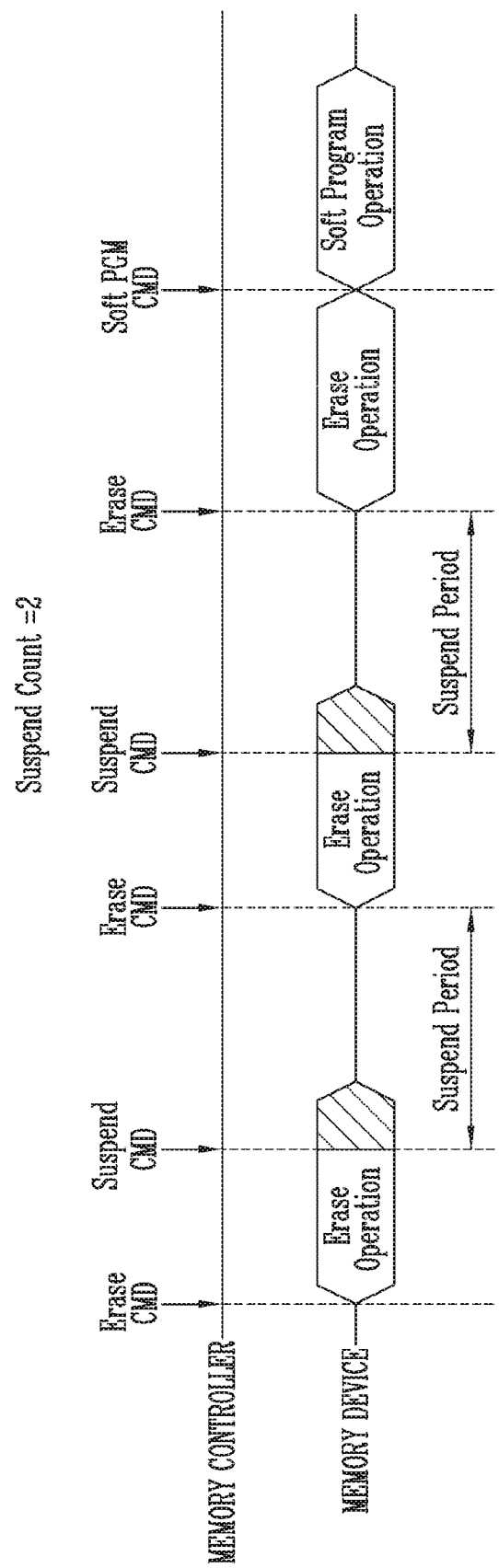
FIG. 8 is a diagram illustrating an example operation of a memory device performed upon receipt of a suspend command provided by a memory controller in the middle of an erase operation on the memory block.

FIG. 8 is a diagram illustrating an example operation of a memory device performed upon receipt of a suspend command provided by a memory controller in the middle of an erase operation on the memory block.

Referring to FIG. 8, the memory controller may provide any one of an erase command Erase CMD, a suspend command Suspend CMD, and a soft program command Soft PGM CMD to the memory device.

The memory controller may provide the erase command Erase CMD for performing an erase operation on an erase target memory block to the memory device. The memory device, upon receipt of the erase command Erase CMD, may perform an erase operation on the erase target memory block.

In some implementations of the disclosed technology, an erase suspend feature allows another operation to interrupt an erase operation that is being performed on the memory block. When another operation is performed in the middle of an erase operation, the memory controller may suspend the erase operation. In this case, the memory controller may provide the suspend command Suspend CMD to the memory device. The memory device, upon receipt of the suspend command Suspend CMD, may suspend the erase operation that is being performed. In FIG. 8, an erase operation corresponding to a curve with oblique lines (hatched portion) cannot be performed due to the suspend command.

When another operation is performed in the middle of an erase operation, the memory controller may suspend the erase operation so that the another operation is performed first and then the erase operation is resumed.

For example, when the erase operation is resumed after the suspension of the erase operation, the memory controller may provide again the memory device with the erase command Erase CMD for the erase target memory block on which the erase operation was suspended in compliance with the suspend command Suspend CMD. As another example, the memory controller may provide a resume command to the memory device.

The memory controller may provide the erase command Erase CMD to the memory device after a suspend period corresponding to the suspend command Suspend CMD has elapsed. In an example implementation, whenever the erase operation is resumed after being suspended, the erase command Erase CMD may be repeatedly provided until the erase operation on the erase target memory block is completed.

The suspend period may be a time during which the performance of the erase operation on the erase target memory block of the memory device is suspended. The memory device may execute the another command that has caused the erase operation to be suspended.

When the erase operation is completed, the memory controller may provide a soft program command Soft PGM CMD for performing a soft program operation. For example, the memory device, upon receipt of the soft program command Soft PGM CMD, may perform a soft program operation on the erase target memory block.

The soft program operation may be an operation of increasing the threshold voltages of memory cells included in the memory block to a predefined threshold voltage distribution. After the erase operation is completed, a soft programming pulse is applied to those memory cells in the erase target memory block which have a threshold voltage below a predetermined minimum value. This soft program operation is repeated until all of those memory cells in the erase target memory block are brought within the predefined threshold voltage distribution (e.g., above the predefined minimum value).

In an embodiment, the soft program operation may be performed after the erase operation on the erase target memory block has been completed. In another embodiment, the soft program operation may be performed before a subsequent program operation on the erased memory block is performed.

FIG. 8 shows a scenario where the memory controller issues the erase command Erase CMD three times and the suspend command Suspend CMD twice until the erase operation on the erase target memory block is completed. It can be seen that the memory controller has provided the soft program command Soft PGM CMD for the erase target memory block after the completion of the erase operation. The number of iterations that the memory controller provides the erase command and the suspend command to the memory device is not limited to this example scenario.

Figure 9:
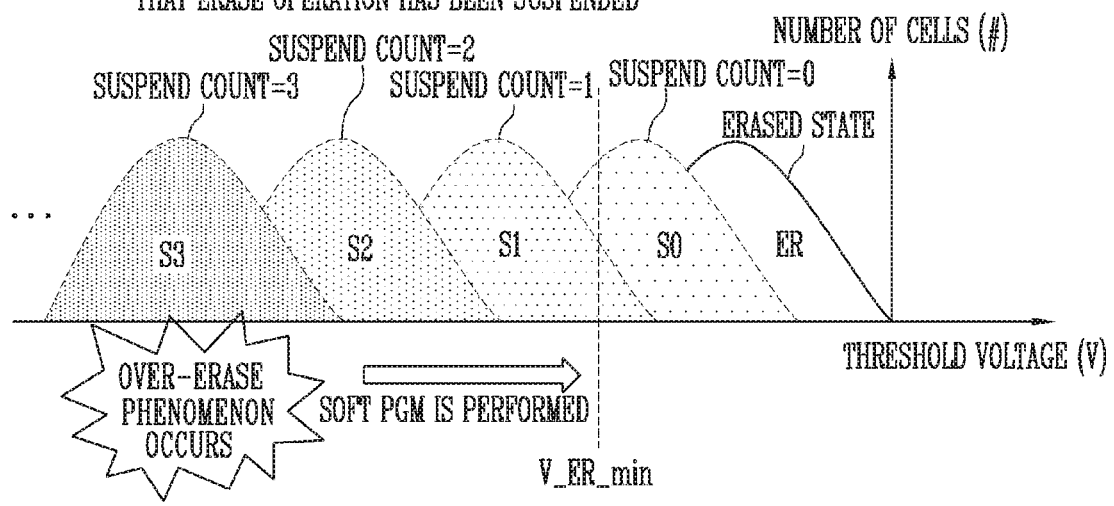
FIG. 9 is a diagram illustrating changes in a threshold voltage distribution as the number of erase suspend/resume cycles increases until the erase operation is completed.

FIG. 9 is a diagram illustrating a change in a threshold voltage distribution as the number of erase suspend/resume cycles increases until the erase operation is completed.

Referring to FIG. 9, a horizontal axis denotes a threshold voltage and a vertical axis denotes the number of memory cells.

Until the erase operation on the memory block is completed, the erase operation may be suspended x times (where x is a positive integer of 0 or more). The number of iterations (x) that the erase operation has been suspended may be referred to as the number of suspensions (x).

Until the erase operation on the memory block is completed, the erase operation may be additionally performed on the memory block as many times as the number of suspensions (x). Therefore, an erase voltage may be additionally applied to the memory block as many times as the number of suspensions (x). As the number of suspensions (x) increases, therefore, the erased memory cells can have a threshold voltage below a predetermined minimum value.

Those erased memory cells having a threshold voltage below a predetermined minimum value can be referred to as over-erased memory cells. The predetermined minimum value may be a minimum value V_ER_min of a threshold voltage distribution corresponding to an erased state ER. In addition, this can be referred to as an "over-erase phenomenon."

In FIG. 9, a threshold voltage distribution S0 to a threshold voltage distribution S3 may indicate the threshold voltage distributions of memory cells included in the erased memory block when the number of suspensions (x) until the erase operation on the memory block is completed are 0 to 3, respectively. As the number of suspensions (x) increases, the corresponding threshold voltage distribution may be further shifted to the left.

In order to prevent memory cells from being over-erased, a soft program operation may be performed upon completion of the erase operation. During the soft program operation, program voltage pulses are applied to shift the threshold voltages of memory cells included in the memory block so that the erased memory cells can have a threshold voltage above the predetermined minimum value of the erased state ER.

Figure 10:
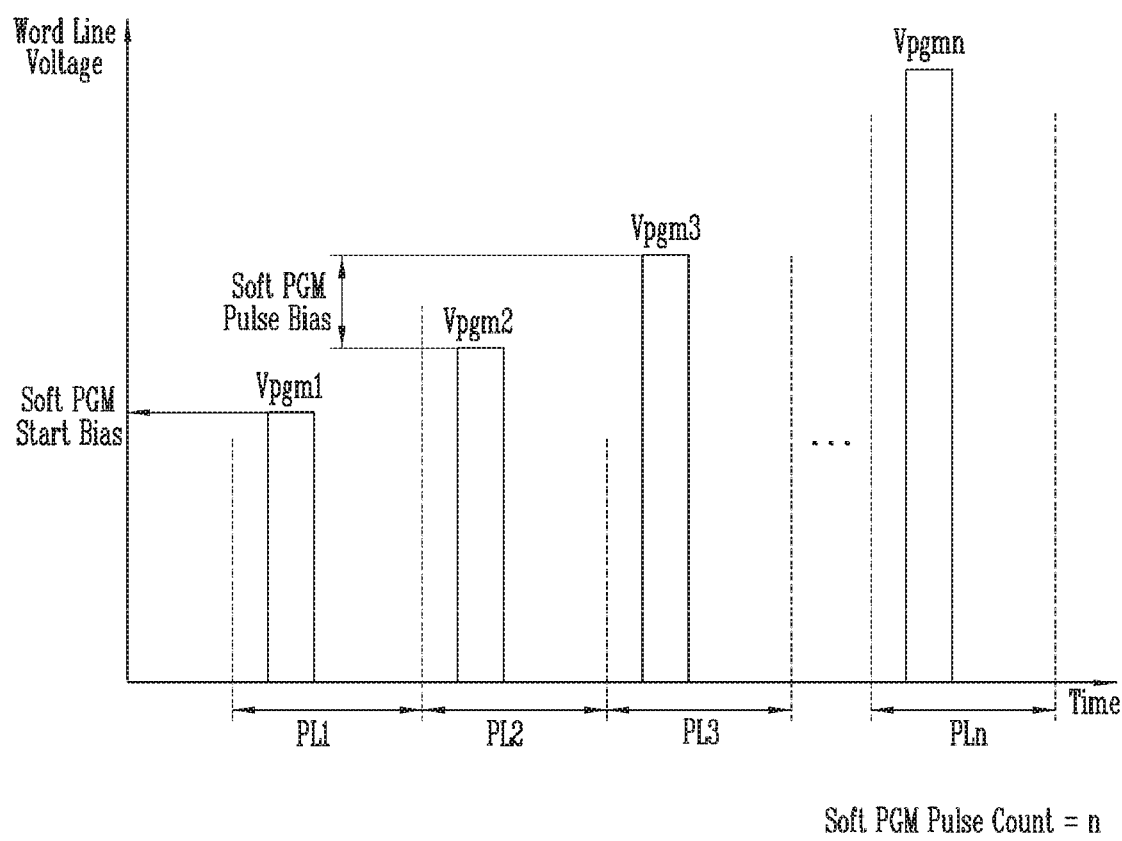
FIG. 10 is a diagram illustrating an example of a soft program operation.

FIG. 10 is a diagram illustrating an example of a soft program operation.

Referring to FIG. 10, a horizontal axis denotes time and a vertical axis denotes a voltage applied to word lines (i.e., a word line voltage).

In some implementations of the erase operation, a desired threshold voltage distribution of the erase state can be obtained as follows. First, an erase pulse is applied to memory cells of an erase target memory block. The memory cells are erase verified using, for example, a maximum threshold voltage of the desired threshold voltage distribution of the erase state. Another erase pulse is applied to the memory cells if there are under-erased memory cells and the memory cells are again erase verified. This erase pulse/erase verify cycle is repeated until it is verified that all the memory cells in the erase target memory block are brought below the maximum threshold voltage of the desired threshold voltage distribution of the erase state. After the erase verify is completed, a soft program operation is performed on the memory cells of the erase target memory block. The memory cells are soft program verified and a soft programming pulse is applied to memory cells that have a threshold voltage below a predetermined minimum value. This cycle is repeated until all the memory cells of the erase target memory block that have a threshold voltage below the predetermined minimum value are brought above the predetermined minimum value.

In some embodiments of the disclosed technology, the soft program operation may be performed on an erased memory block. When the soft program operation is performed, a program voltage may be applied to word lines coupled to the memory block. When the soft program operation is performed, a ground voltage may be applied to bit lines coupled to the memory block. When the soft program operation is performed, a program verify operation may be omitted.

The soft program operation may include first to n-th program loops PL1 to PLn (where n is a positive integer). A soft program pulse count (Soft PGM Pulse Count) may be the number of repetitions (n) of the program loop PL.

In each program loop PL, a ground voltage may be applied to the channel regions of a plurality of memory cell strings included in the memory block. A program voltage Vpgm may be applied to word lines coupled to the memory block while the ground voltage is being applied to the channel regions.

The program voltage Vpgm of each program loop PL is increased by the soft program pulse bias (Soft PGM Pulse Bias) as the program loop PL progresses. At each iteration of the program loop PL, the level of the program voltage Vpgm may be increased by the soft program pulse bias (Soft PGM Pulse Bias) (Incremental Step Pulse Erase: ISPE).

In FIG. 10, the level of the program voltage Vpgm2 of the second program loop PL2 is higher than that of the program voltage Vpgm1 of the first program loop PL1 by the soft program pulse bias (Soft PGM Pulse Bias). The level of the program voltage Vpgm3 of the third program loop PL3 is higher than that of the program voltage Vpgm2 of the second program loop PL2 by the soft program pulse bias (Soft PGM Pulse Bias). Similarly, the level of the program voltage Vpgmn of the n-th program loop PLn is higher than that of the program voltage Vpgm(n−1) of the (n−1)-th program loop PL(n−1) by the soft program pulse bias (Soft PGM Pulse Bias).

The soft program start bias (Soft PGM Start Bias) may be the magnitude of the program voltage that is initially applied during the soft program operation. Therefore, the soft program start bias (Soft PGM Start Bias) may be the program voltage Vpgm1 of the first program loop PL1.

FIG. 11 is a diagram illustrating an example of a soft program setting table.

Referring to FIG. 11, a soft program setting table SOFT PROGRAM SETTING TABLE a may include soft program setting information that indicates soft program operating conditions, which differ from each other depending on the number of erase suspend/resume cycles (i.e., suspend count). The number of erase suspend/resume cycle (i.e., suspend count) may be indicated as an integer equal to or greater than 0. The soft program operating conditions may include at least one of a soft program start bias (Soft PGM Start Bias), a soft program pulse count (Soft PGM Pulse Count), and a soft program pulse bias (Soft PGM Pulse Bias), which are described above with reference to FIG. 10.

In FIG. 11, when the suspend count indicating the number of erase suspend/resume cycles is 0, the soft program start bias (Soft PGM Start Bias), among the soft program operating conditions, may have a default value X_default. The soft program pulse count (Soft PGM Pulse Count) may have a default value Y_default. The soft program pulse bias (Soft PGM Pulse Bias) may have a default value Z_default.

When the suspend count indicating the number of erase suspend/resume cycles is 1, the soft program start bias (Soft PGM Start Bias), among the soft program operating conditions, may have a first value X_1. The soft program pulse count (Soft PGM Pulse Count) may have a first value Y_1. The soft program pulse bias (Soft PGM Pulse Bias) may have a first value Z_1.

Similarly, when the suspend count indicating the number of erase suspend/resume cycles is n (where n is a natural number), the soft program start bias (Soft PGM Start Bias), among the soft program operating conditions, may have an n-th value X_n. The soft program pulse count (Soft PGM Pulse Count) may have an n-th value Y_n. The soft program pulse bias (Soft PGM Pulse Bias) may have an n-th value Z_n.

In an embodiment, as the suspend count indicating the number of erase suspend/resume cycles is increased, respective values of the soft program start bias (Soft PGM Start Bias), the soft program pulse count (Soft PGM Pulse Count), and the soft program pulse bias (Soft PGM Pulse Bias) may be increased.

FIG. 12 is a diagram illustrating an example of a soft program setting table.

Referring to FIG. 12, a soft program setting table SOFT PROGRAM SETTING TABLE b may include soft program setting information that indicates soft program operating conditions depending on the level of a hard erase verify (HEV) voltage. The HEV voltage may be a read voltage for determining the threshold voltage distributions of memory cells included in an erased memory block.

In some implementations of the erase operation, an erase pulse is applied to memory cells of an erase target memory block, and then the memory cells are erase verified using the hard erase verify (HEV) voltage to bring the threshold voltages of the memory cells below the hard erase verify (HEV) voltage.

The soft program setting table b may indicate soft program operating conditions depending on the level of the HEV voltage, instead of the suspend count indicating the number of erase suspend/resume cycles in the soft program setting table a, described above with reference to FIG. 11.

In some embodiments of the disclosed technology, the level of the hard erase verify (HEV) voltage may be the level of a fail verify voltage that is an HEV voltage when the memory block fails the verification at the HEV operation.

Whether the memory block has passed or failed the verification at the HEV operation may be determined based on the result of reading memory cells included in the memory block using the HEV voltage. A read operation may be performed on memory cells included in the erased memory block using the HEV voltage. When the number of fail bits, indicating the number of memory cells that are read as OFF cells (e.g., programmed cell) as a result of performing the read operation, is equal to or greater than a set threshold value, it may be determined that the memory block has failed the verification at the HEV operation. When the number of fail bits is less than the set threshold value, it may be determined that the memory block has passed the verification at the HEV operation.

The HEV voltage may have a plurality of levels REV_default to REV_n. The HEV voltage may have a positive value, 0 V, or a negative value. As the level of the HEV voltage is increased, the magnitude of the HEV voltage may be decreased.

In an embodiment, when the HEV voltage is at a default level REV_default, a soft program start bias (Soft PGM Start Bias), among the soft program operating conditions, may have a default value X_default. A soft program pulse count (Soft PGM Pulse Count) may have a default value Y_default. A soft program pulse bias (Soft PGM Pulse Bias) may have a default value Z_default.

When the HEV voltage is at a first level HEV_1, the soft program start bias (Soft PGM Start Bias), among the soft program operating conditions, may have a first value X_1. The soft program pulse count (Soft PGM Pulse Count) may have a first value Y_1. The soft program pulse bias (Soft PGM Pulse Bias) may have a first value Z_1.

Similarly, when the HEV voltage is at an n-th level HEV_n (where n is a natural number of 1 or more), the soft program start bias (Soft PGM Start Bias), among the soft program operating conditions, may have an n-th value X_n. The soft program pulse count (Soft PGM Pulse Count) may have an n-th value Y_n. The soft program pulse bias (Soft PGM Pulse Bias) may have an n-th value Z_n.

Figures 13, 14:
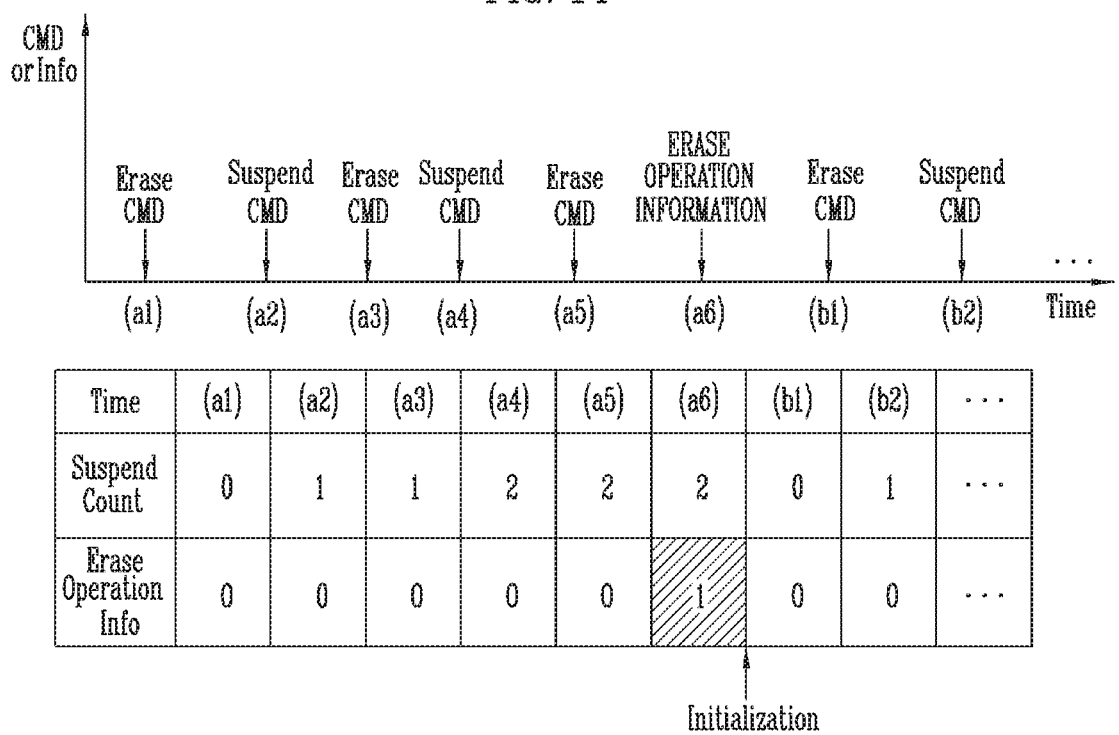
FIG. 13 is a diagram illustrating an example of suspend count information.
FIG. 14 is a timing diagram for explaining a procedure for updating suspend count information in FIG. 13.

FIG. 13 is a diagram illustrating an example of suspend count information.

Referring to FIG. 13, the suspend count information may include a suspend count value (Suspend Count) and erase operation information (Erase Operation Info).

The suspend count value Suspend Count indicates the number of iterations that an erase operation on a memory block has been suspended until the erase operation is completed. In some embodiments of the disclosed technology, the suspend count value Suspend Count may be the number of suspend commands that are issued by a memory controller and provided to a memory device until the erase operation on the memory block is completed.

The erase operation information (Erase Operation Info) may indicate whether the erase operation on the memory block has been completed. The erase operation information Erase Operation Info may be acquired from the memory device through a status read response. In some example implementation of the disclosed technology, the memory device may provide the status read response to the memory controller in response to a status read command provided from the memory controller. The status read response may indicate whether an operation of memory device has been completed. For example, the status read response may be 'idle' when the operation has been completed. The status read response may be 'busy' when the operation has not been completed.

In an embodiment of the disclosed technology, the erase operation information Erase Operation Info may have a value of 0 when the erase operation is not yet completed. When the erase operation has been completed, the erase operation information Erase Operation Info may have a value of 1. In another embodiment of the disclosed technology, the erase operation information Erase Operation Info may have a value of 1 when the erase operation is not yet completed. In this case, when the erase operation has been completed, the erase operation information Erase Operation Info may have a value of 0.

FIG. 14 is a timing diagram for explaining a procedure for updating suspend count information in FIG. 13.

Referring to FIG. 14, a horizontal axis denotes time and a vertical axis denotes the type of command that is provided by a memory controller to a memory device or information that is acquired from the memory device.

The suspend count information may include a suspend count value (Suspend Count) and erase operation information (Erase Operation Info).

The suspend count value Suspend Count indicates the number of iterations that an erase operation on a memory block has been suspended until the erase operation is completed. The initial value of the suspend count value Suspend Count may be "0," and it may be increased by 1 whenever the memory controller provides a suspend command to the memory device.

The erase operation information (Erase Operation Info) may indicate whether the erase operation on the memory block has been completed. The erase operation information Erase Operation Info may be acquired from the memory device through a status read response after the memory controller has provided an erase command to the memory device. However, when the memory controller provides the suspend command after providing the erase command, the erase operation information Erase Operation Info may not be acquired. The initial value of the Erase Operation Info may indicate "0." The erase operation information Erase Operation Info may be updated with "1" when the erase operation on the memory block is completed.

In FIG. 14, at time (a1), the memory controller may provide an erase command to the memory device. The suspend count value Suspend Count has a value of "0" as an initial value. The erase operation information Erase Operation Info has a value of "0 as an initial value.

At time (a2), the memory controller provides a suspend command to the memory device. When another operation is performed in the middle of an erase operation, the memory controller may provide the suspend command to the memory device in order to suspend the erase operation that is being performed. The suspend count value Suspend Count may be increased by 1. The erase operation information Erase Operation Info is maintained at the initial value of 0.

At time (a3), the memory controller may provide again an erase command for an erase target memory block on which the erase operation is suspended. Here, whenever the erase operation is resumed after being suspended, the erase command may be repeatedly provided to the memory device until the erase operation on the erase target memory block is completed. Time (a3) may indicate a time after a suspend period, corresponding to the suspend command provided by the memory controller at time (a2), has elapsed. The suspend count value Suspend Count is maintained at a value of 1. The erase operation information Erase Operation Info is maintained at the initial value of 0.

At time (a4), the memory controller may provide a suspend command to the memory device. The suspend count value Suspend Count may be increased by 1, and thus now it has a value of 2. The erase operation information Erase Operation Info is maintained at the initial value of 0.

At time (a5), the memory controller may provide an erase command to the memory device. The suspend count value Suspend Count is maintained at the value of 2. The erase operation information Erase Operation Info is maintained at the initial value of 0.

At time (a6), the memory controller may acquire erase operation information, indicating whether the erase operation on the memory block has been completed, from the memory device through a status read response. The suspend count value Suspend Count is maintained at a value of 2. When the acquired erase operation information (Erase Operation Info) indicates that the erase operation has been completed, the erase operation information Erase Operation Info included in the suspend count information may be updated with 1 from the initial value of 0.

When the erase operation information Erase Operation Info is updated with 1, the suspend count information may be utilized for determining the soft program operating conditions, described above with reference to FIG. 11. Thereafter, both the suspend count value Suspend Count and the erase operation information Erase Operation Info, included in the suspend count information, may be initialized to "0," which is the initial value.

At time (b1), the memory controller may provide an erase command to the memory device. The suspend count value Suspend Count has the initial value of 0. The erase operation information Erase Operation Info has the initial value of 0.

At time (b2), the memory controller may provide a suspend command to the memory device. The suspend count value Suspend Count may be increased by 1 and thus it now has a value of 1. The erase operation information Erase Operation Info is maintained at the initial value of 0.

Similarly, the suspend count value Suspend Count and the erase operation information Erase Operation Info, which are included in the suspend count information, may be updated.

Figure 15:
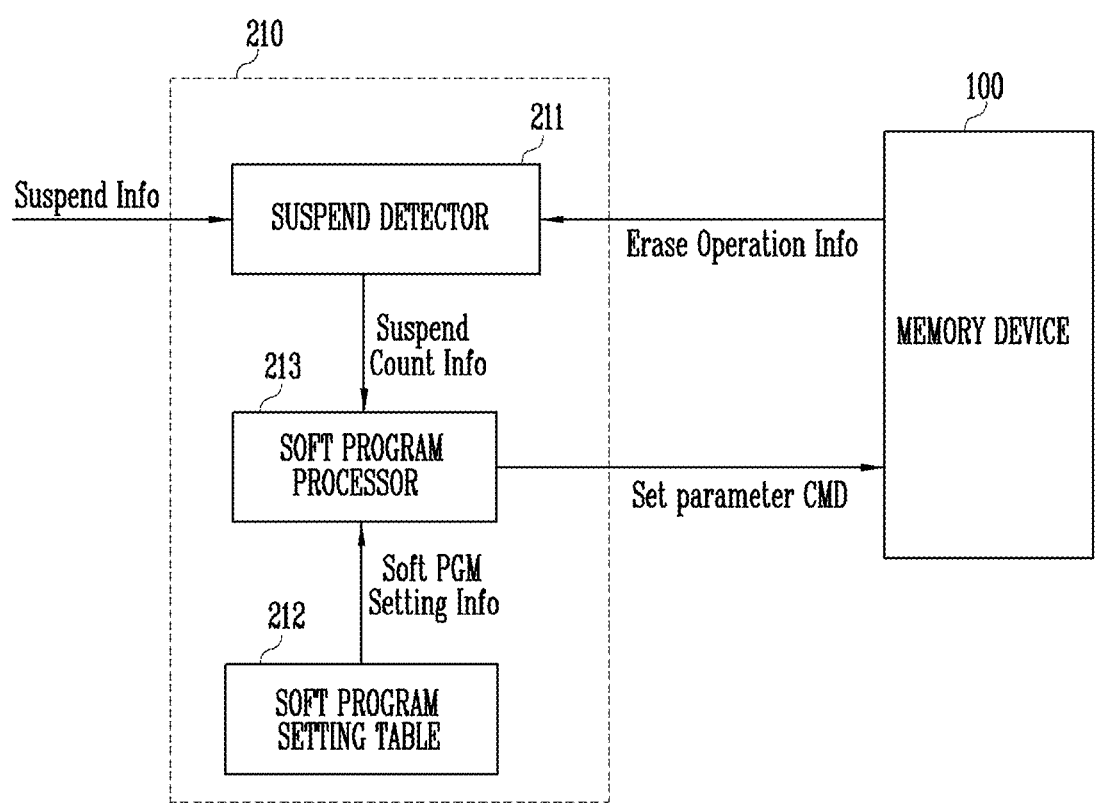
FIG. 15 is a diagram illustrating a soft program operation based on an embodiment of the disclosed technology.

FIG. 15 is a diagram illustrating a soft program operation based on an embodiment of the disclosed technology.

Referring to FIG. 15, a soft program controller 210 may include a suspend detector 211, a soft program setting table 212, and a soft program processor 213.

The suspend detector 211 may count the number of iterations that an erase operation on an erase target memory block has been suspended while the erase operation is being performed based on suspend information (Suspend Info). The suspend information Suspend Info may indicate that a memory controller has provided a suspend command to a memory device. The number of iterations that the erase operation has been suspended may be indicated by the number of suspend commands that are provided by the memory controller to the memory device 100.

The suspend detector 211 may acquire erase operation information (Erase Operation Info) indicating whether the erase operation on the memory block has been completed through a status read response from the memory device 100. When the acquired erase operation information Erase Operation Info indicates that the erase operation has been completed, the suspend detector 211 may generate suspend count information (Suspend Count Info), described with reference to FIG. 13, and may provide the suspend count information to the soft program processor 213.

The soft program setting table 212 may be a soft program setting table a, described above with reference to FIG. 11. The soft program setting table 212 may include soft program setting information (Soft PGM Setting Info) that indicates soft program operating conditions, which differ from each other depending on the number of erase suspend/resume cycles. The soft program operating conditions may include at least one of a soft program start bias, a soft program pulse count, and a soft program pulse bias.

The soft program processor 213 may set a soft program voltage that is a voltage to be used for a soft program operation based on the soft program setting information (Soft PGM Setting Info) and the suspend count information (Suspend Count Info). The soft program processor 213 may provide a soft program command, which instructs a soft program operation to be performed, to the memory device 100 using the set soft program voltage. The soft program processor 213 may provide a set parameter command for setting the soft program voltage to the memory device 100.

Figure 16:
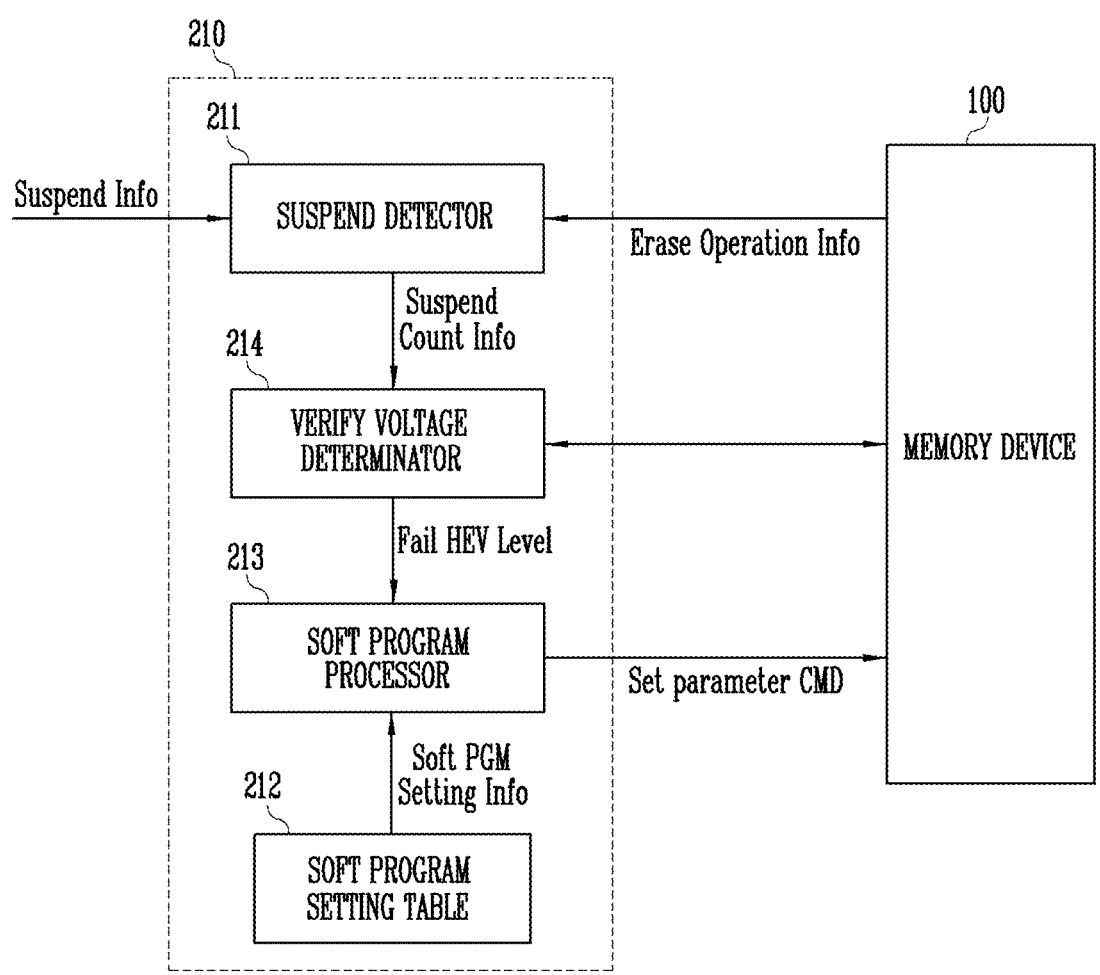
FIG. 16 is a diagram illustrating an example of a soft program operation based on an embodiment of the disclosed technology.

FIG. 16 is a diagram illustrating an example of a soft program operation based on an embodiment of the disclosed technology.

Referring to FIG. 16, a soft program controller 210 may include a suspend detector 211, a soft program setting table 212, a soft program processor 213, and a verify voltage determinator 214.

The suspend detector 211 may be the same component as the suspend detector 211, described above with reference to FIG. 15. However, unlike the suspend detector 211 described with reference to FIG. 15, the suspend detector 211 in FIG. 16 may provide suspend count information (Suspend Count Info) to the verify voltage determinator 214.

The soft program setting table 212 may be a soft program setting table b described above with reference to FIG. 12. The soft program setting table 212 may include soft program setting information (Soft PGM Setting Info) that indicates soft program operating conditions, which differ from each other depending on the level of a hard erase verify (HEV) voltage.

The soft program processor 213 may be the same component as the soft program processor 213, described above with reference to FIG. 15. However, unlike the soft program processor 213 described with reference to FIG. 15, the soft program processor 213 may set a soft program voltage to be used for a soft program operation based on the soft program setting information (Soft PGM Setting Info) and the level of a fail verify voltage (Fail HEV Level), instead of the suspend count information (Suspend Count Info).

The verify voltage determinator 214 may perform a hard erase verify (HEV) operation on an erased memory block. The verify voltage determinator 214 may perform a read operation on the memory cells included in the erased memory block using the hard erase verify (HEV) voltage during the hard erase verify (HEV) operation. The verify voltage determinator 214 may determine that the memory block has failed the verification at the HEV operation when the number of fail bits, indicating the number of memory cells that are read as OFF cells (e.g., programmed cells) as a result of performing the read operation, is equal to or greater than a set threshold value. The verify voltage determinator 214 may determine that the memory block has passed the verification at the HEV operation when the number of fail bits is less than the set threshold value.

In an embodiment, the verify voltage determinator 214 may decide on the level of the HEV voltage depending on the suspend count information (Suspend Count Info). The HEV operation may be repeatedly performed until the memory block fails to pass the verification at the HEV operation. As the HEV operation is repeated, the level of the HEV voltage used for the HEV operation may be increased. As the level of the HEV voltage is increased, the magnitude of the HEV voltage may be decreased. The HEV voltage may have a positive value, 0 V or a negative value.

The verify voltage determinator 214 may repeatedly perform the HEV operation until the memory block has failed the HEV operation. The verify voltage determinator 214 may provide the level of a fail verify voltage (Fail HEV Level), which is an HEV voltage when the memory block fails the HEV operation, to the soft program processor 213.

Figure 17:
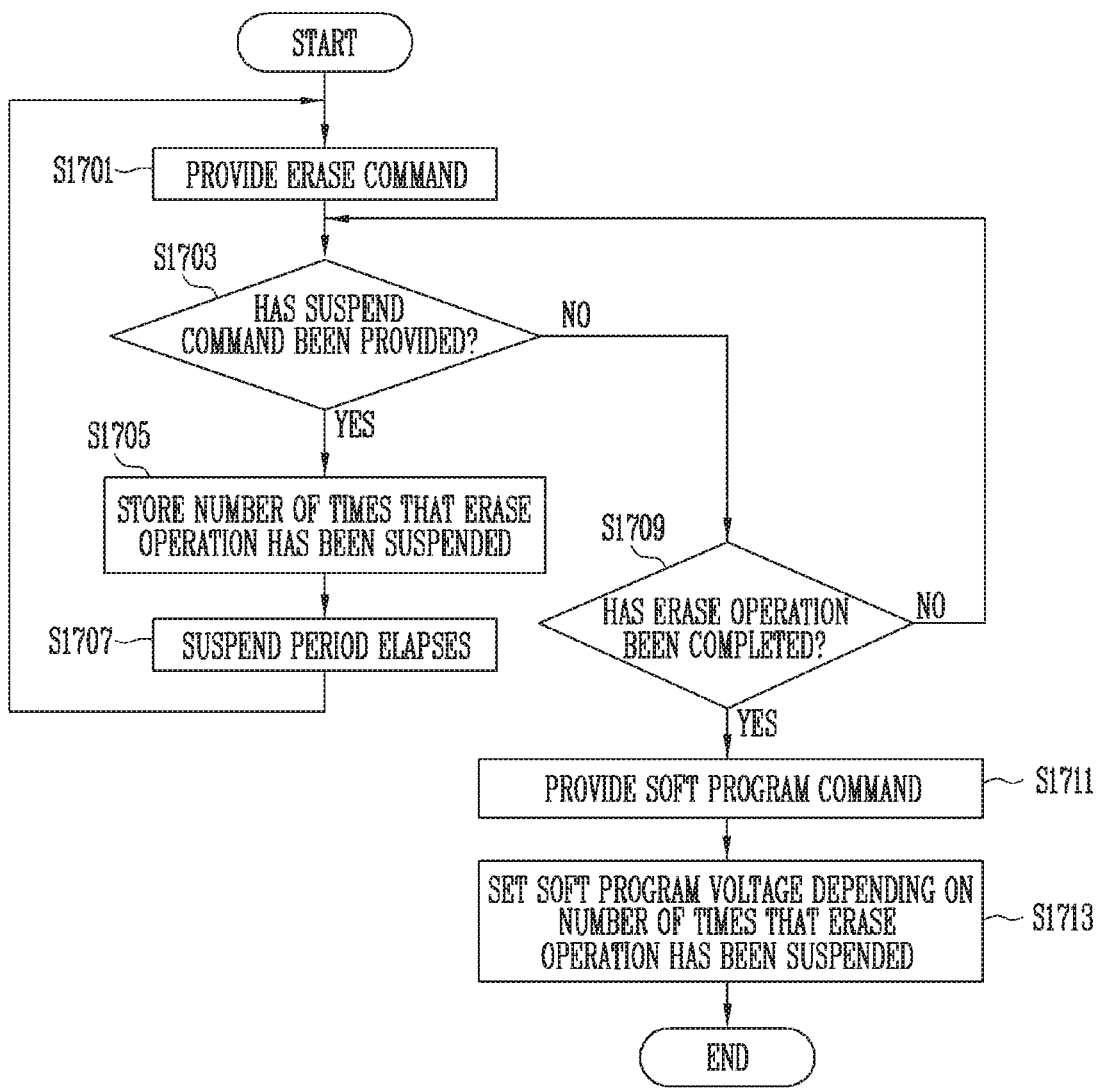
FIG. 17 is a flowchart illustrating an example operation of a memory controller based on an embodiment of the disclosed technology.

FIG. 17 is a flowchart illustrating an example operation of a memory controller based on an embodiment of the disclosed technology.

Referring to FIG. 17, at step S1701, the memory controller may provide an erase command to a memory device in order to perform an erase operation on a memory block.

At step S1703, the memory controller may determine whether the memory controller has provided a suspend command to the memory device. When it is determined that the memory controller has provided the suspend command to the memory device, the process proceeds to step S1705, whereas when it is determined that the memory controller has not provided the suspend command, the process proceeds to step S1709. The suspend command may be a command for instructing the suspension of the erase operation on the memory block.

At step S1705, the memory controller may store information about the number of iterations that the erase operation on the memory block has been suspended (e.g., erase suspend/resume cycles). The erase suspend/resume cycles may be the number of suspend commands provided by the memory controller to the memory device.

At step S1707, the memory controller may provide an additional command to the memory device until a suspend period has elapsed.

At step S1709, the memory controller may determine whether the erase operation on the memory block has been completed. When it is determined that the erase operation has been completed, the process proceeds to step S1711, otherwise the process returns to step S1703.

At step S1711, the memory controller may provide a soft program command for instructing a soft program operation to be performed on the erased memory block to the memory device.

At step S1713, the memory controller may set a soft program voltage to be used for the soft program operation based on the stored information, that is, the number of iterations that the erase operation has been suspended. The memory controller may provide a set parameter command for setting the soft program voltage to the memory device.

In an embodiment, the memory controller may decide on the level of a hard erase verify (HEV) voltage based on the stored information, that is, the number of iterations that the erase operation has been suspended, and may perform an HEV operation. The memory controller may decide on the level of a fail verify voltage which is the HEV voltage when the memory block fails the verification at the HEV operation, based on the result of performing the HEV operation. The memory controller may set a soft program voltage to be used for the soft program operation based on the level of the fail verify voltage and a soft program setting table b, described above with reference to FIG. 12. The memory controller may provide a set parameter command for setting the soft program voltage to the memory device.

Figure 18:
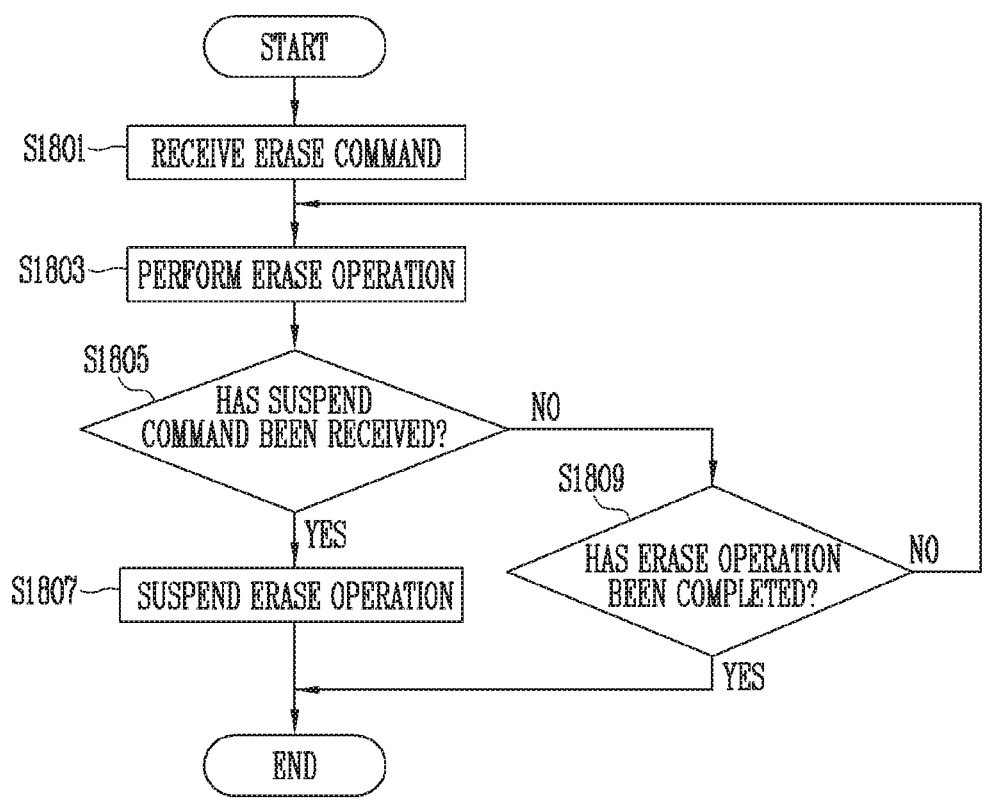
FIG. 18 is a flowchart illustrating an example operation of a memory device based on an embodiment of the disclosed technology.

FIG. 18 is a flowchart illustrating an example operation of a memory device based on an embodiment of the disclosed technology.

Referring to FIG. 18, at step S1801, the memory device may receive an erase command for a memory block from a memory controller.

At step S1803, the memory device may perform an erase operation on a memory block corresponding to the erase command.

At step S1805, the memory device may determine whether a suspend command has been received from the memory controller. When it is determined that the suspend command has been received from the memory controller, the process proceeds to step S1807, otherwise the process proceeds to step S1809.

At step S1807, the memory device suspends the erase operation on the memory block.

At step S1809, the memory device may determine whether the erase operation on the memory block has been completed. When it is determined that the erase operation on the memory block has been completed, the process is terminated, otherwise the process returns to step S1803.

Figure 19:
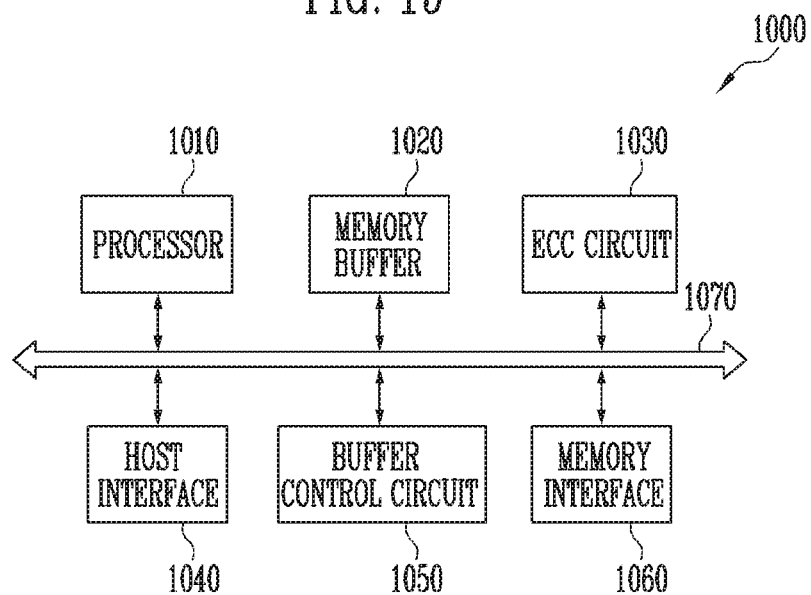
FIG. 19 is a diagram illustrating an example of the memory controller of FIG. 1 implemented based on an embodiment of the disclosed technology.

FIG. 19 is a diagram illustrating an example of the memory controller of FIG. 1 implemented based on an embodiment of the disclosed technology.

Referring to FIG. 19, a memory controller 1000 is coupled to a host and a memory device. In response to a request received from the host, the memory controller 1000 may access the memory device. For example, the memory controller 1000 may be configured to control write, read, erase, and background operations of the memory device. The memory controller 1000 may provide an interface between the memory device and the host. The memory controller 1000 may run firmware for controlling the memory device.

The memory controller 1000 may include a processor 1010, a memory buffer 1020, an error checking and correction (ECC) circuit 1030, a host interface 1040, a buffer control circuit 1050, a memory interface 1060, and a bus 1070.

The bus 1070 may provide channels between components of the memory controller 1000.

The processor 1010 may control the overall operation of the memory controller 1000 and may perform a logical operation. The processor 1010 may communicate with an external host through the host interface 1040 and also communicate with the memory device through the memory interface 1060. Further, the processor 1010 may communicate with the memory buffer 1020 through the buffer control circuit 1050. The processor 1010 may control the operation of the storage device by using the memory buffer 1020 as a working memory, a cache memory or a buffer memory.

The processor 1010 may perform the function of a flash translation layer (FTL). The processor 1010 may translate a logical block address (LBA), provided by the host, into a physical block address (PBA) through the FTL. The FTL may receive the LBA and translate the LBA into the PBA using a mapping table. Examples of an address mapping method performed through the FTL may include various methods according to a mapping unit. Representative address mapping methods include a page mapping method, a block mapping method, and a hybrid mapping method.

The processor 1010 may randomize data received from the host. For example, the processor 1010 may use a randomizing seed to randomize data received from the host. The randomized data may be provided, as data to be stored, to the memory device and may be programmed in the memory cell array.

The processor may derandomize data received from the memory device during a read operation. For example, the processor 1010 may derandomize the data received from the memory device using a derandomizing seed. The derandomized data may be output to the host.

In an embodiment, the processor 1010 may run software or firmware to perform randomizing and derandomizing operations.

The memory buffer 1020 may be used as a working memory, a cache memory, or a buffer memory of the processor 1010. The memory buffer 1020 may store codes and commands executed by the processor 1010. The memory buffer 1020 may store data that is processed by the processor 1010. The memory buffer 1020 may include a static RAM (SRAM) or a dynamic RAM (DRAM).

The Ecc circuit 1030 may perform error correction. The Ecc circuit 1030 may perform error correction code (ECC) encoding based on data to be written to the memory device through the memory interface 1060. The ECC-encoded data may be transferred to the memory device through the memory interface 1060. The Ecc circuit 1030 may perform ECC decoding based on data received from the memory device through the memory interface 1060. In an example, the Ecc circuit 1030 may be included as the component of the memory interface 1060 in the memory interface 1060.

The host interface 1040 may communicate with the external host under the control of the processor 1010. The host interface 1040 may perform communication using at least one of various communication methods such as Universal Serial Bus (USB), Serial AT Attachment (SATA), Serial Attached SCSI (SAS), High Speed Interchip (HSIC), Small Computer System Interface (SCSI), Peripheral Component Interconnection (PCI), PCI express (PCIe), Nonvolatile Memory express (NVMe), Universal Flash Storage (UFS), Secure Digital (SD), MultiMedia Card (MMC), embedded MMC (eMMC), Dual In-line Memory Module (DIMM), Registered DIMM (RDIMM), and Load Reduced DIMM (LRDIMM) communication methods.

The buffer control circuit 1050 may control the memory buffer 1020 under the control of the processor 1010.

The memory interface 1060 may communicate with the memory device under the control of the processor 1010. The memory interface 1060 may transmit/receive commands, addresses, and data to/from the memory device through channels.

In an embodiment, the memory controller 1000 may not include the memory buffer 1020 and the buffer control circuit 1050.

In an embodiment, the processor 1010 may control the operation of the memory controller 1000 using codes. The processor 1010 may load codes from a nonvolatile memory device (e.g., ROM) provided in the memory controller 1000. In an embodiment, the processor 1010 may load codes from the memory device through the memory interface 1060.

In an embodiment, the bus 1070 of the memory controller 1000 may be divided into a control bus and a data bus. The data bus may be configured to transmit data in the memory controller 1000, and the control bus may be configured to transmit control information such as commands or addresses in the memory controller 1000. The data bus and the control bus may be isolated from each other, and may neither interfere with each other nor influence each other. The data bus may be coupled to the host interface 1040, the buffer control circuit 1050, the Ecc circuit 1030, and the memory interface 1060. The control bus may be coupled to the host interface 1040, the processor 1010, the buffer control circuit 1050, the memory buffer 1020, and the memory interface 1060.

Figure 20:
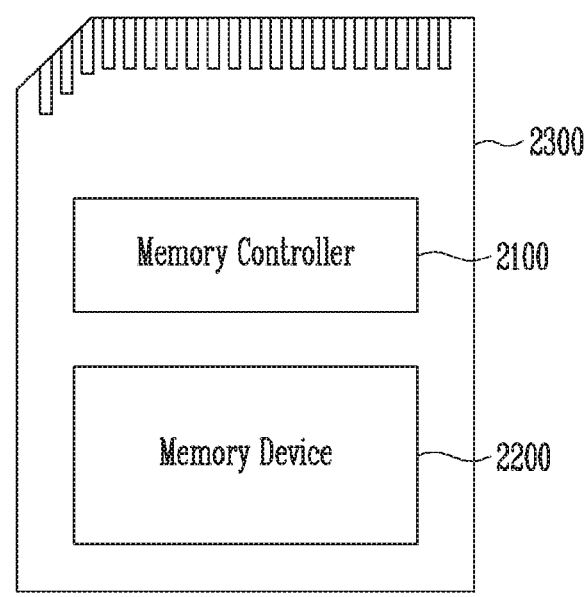
FIG. 20 is a block diagram illustrating an example of a memory card system including the storage device implemented based on an embodiment of the disclosed technology.

FIG. 20 is a block diagram illustrating an example of a memory card system including the storage device implemented based on an embodiment of the disclosed technology.

Referring to FIG. 20, a memory card system 2000 may include a memory controller 2100, a memory device 2200, and a connector 2300.

The memory controller 2100 is coupled to the memory device 2200. The memory controller 2100 may access the memory device 2200. For example, the memory controller 2100 may be control read, write, erase, and background operations of the memory device 2200. The memory controller 2100 may provide an interface between the memory device 2200 and a host. The memory controller 2100 may run firmware for controlling the memory device 2200. The memory controller 2100 may be implemented in the same way as the memory controller 200 described above with reference to FIG. 1.

In an embodiment, the memory controller 2100 may include components, such as a RAM, a processor, a host interface, a memory interface, and an Ecc circuit.

The memory controller 2100 may communicate with an external device through the connector 2300. The memory controller 2100 may communicate with an external device (e.g., a host) based on a specific communication protocol. In an embodiment, the memory controller 2100 may communicate with the external device through at least one of various communication protocols such as universal serial bus (USB), multimedia card (MMC), embedded MMC (eMMC), peripheral component interconnection (PCI), PCI-express (PCI-E), advanced technology attachment (ATA), serial-ATA (SATA), parallel-ATA (PATA), small computer small interface (SCSI), enhanced small disk interface (ESDI), integrated drive electronics (IDE), Firewire, universal flash storage (UFS), Wi-Fi, Bluetooth, and nonvolatile memory express (NVMe) protocols. In an embodiment, the connector 2300 may be defined by at least one of the above-described various communication protocols.

In an embodiment, the memory device 2200 may be implemented as any of various nonvolatile memory devices, such as an Electrically Erasable and Programmable ROM (EEPROM), a NAND flash memory, a NOR flash memory, a Phase-change RAM (PRAM), a Resistive RAM (ReRAM), a Ferroelectric RAM (FRAM), a Spin-Torque Magnetic RAM (STT-MRAM).

The memory controller 2100 and the memory device 2200 may be integrated into a single semiconductor device to configure a memory card. For example, the memory controller 2100 and the memory device 2200 may be integrated into a single semiconductor device to configure a memory card such as a PC card (personal computer memory card international association: PCMCIA), a compact flash card (CF), a smart media card (SM or SMC), a memory stick, a multimedia card (MMC, RS-MMC, MMCmicro or eMMC), a SD card (SD, miniSD, microSD, or SDHC), or a universal flash storage (UFS).

Figure 21:
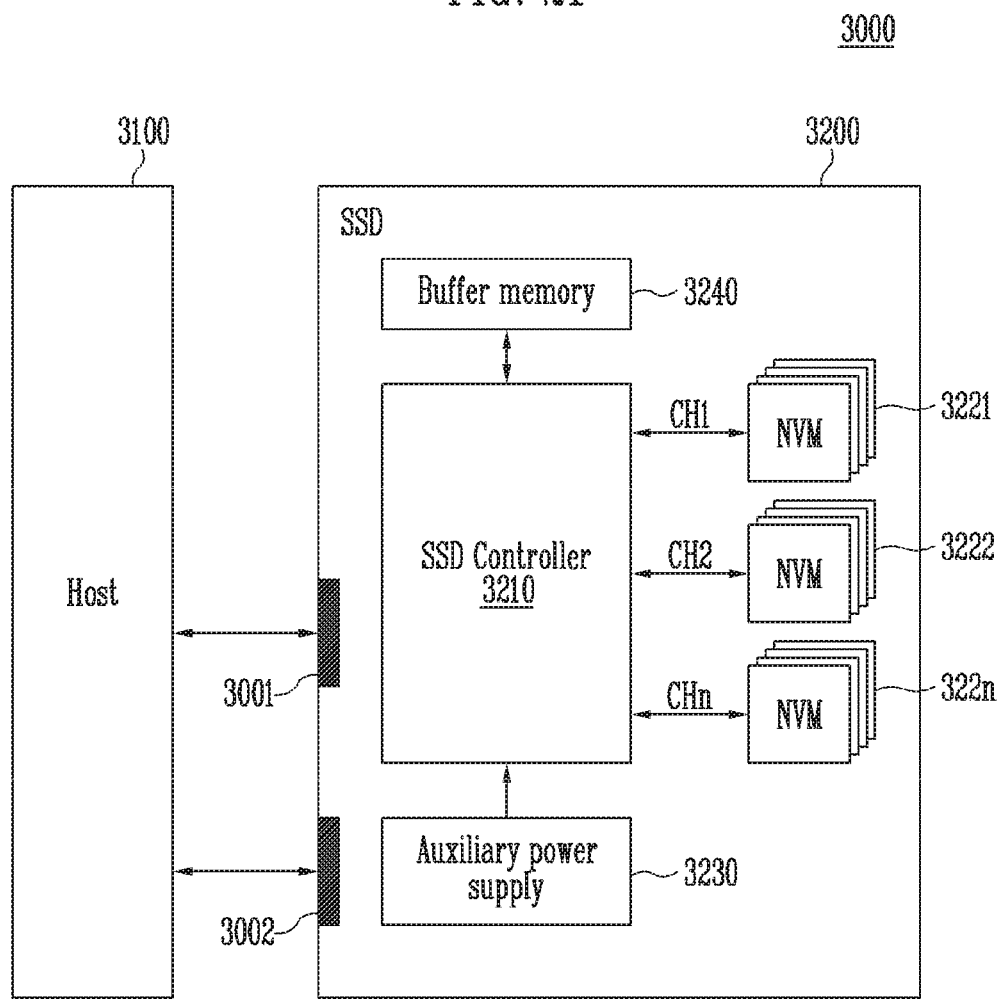
FIG. 21 is a block diagram illustrating an example of a solid state drive (SSD) system including the storage device implemented based on an embodiment of the disclosed technology.

FIG. 21 is a block diagram illustrating a solid state drive (SSD) system including the storage device implemented based on an embodiment of the disclosed technology.

Referring to FIG. 21, an SSD system 3000 may include a host 3100 and an SSD 3200. The SSD 3200 may exchange signals SIG with the host 3100 through a signal connector 3001 and may receive power PWR through a power connector 3002. The SSD 3200 may include an SSD controller 3210, a plurality of flash memories 3221 to 322$n$, an auxiliary power supply 3230, and a buffer memory 3240.

In accordance with an embodiment of the present disclosure, the SSD controller 3210 may perform the function of the memory controller 200 described above with reference to FIG. 1.

The SSD controller 3210 may control the plurality of flash memories 3221 to 322$n$ in response to the signals SIG received from the host 3100. In an embodiment, the signals SIG may be signals based on the interfaces of the host 3100 and the SSD 3200. For example, the signals SIG may be signals defined by at least one of various interfaces such as universal serial bus (USB), multimedia card (MMC), embedded MMC (eMMC), peripheral component interconnection (PCI), PCI-express (PCI-E), advanced technology attachment (ATA), serial-ATA (SATA), parallel-ATA (PATA), small computer small interface (SCSI), enhanced small disk interface (ESDI), integrated drive electronics (IDE), Firewire, universal flash storage (UFS), Wi-Fi, Bluetooth, and nonvolatile memory express (NVMe) interfaces.

The auxiliary power supply 3230 may be coupled to the host 3100 through the power connector 3002. The auxiliary power supply 3230 may be supplied with power PWR from the host 3100 and may be charged. The auxiliary power supply 3230 may supply the power of the SSD 3200 when the supply of power from the host 3100 is not smoothly performed. In an embodiment, the auxiliary power supply 3230 may be positioned inside the SSD 3200 or positioned outside the SSD 3200. For example, the auxiliary power supply 3230 may be disposed in a main board and may supply auxiliary power to the SSD 3200.

The buffer memory 3240 functions as a buffer memory of the SSD 3200. For example, the buffer memory 3240 may temporarily store data received from the host 3100 or data received from the plurality of flash memories 3221 to 322$n$ or may temporarily store metadata (e.g., mapping tables) of the flash memories 3221 to 322$n$. The buffer memory 3240 may include volatile memories such as DRAM, SDRAM, DDR SDRAM, LPDDR SDRAM, and GRAM or nonvolatile memories such as FRAM, ReRAM, STT-MRAM, and PRAM.

Figure 22:
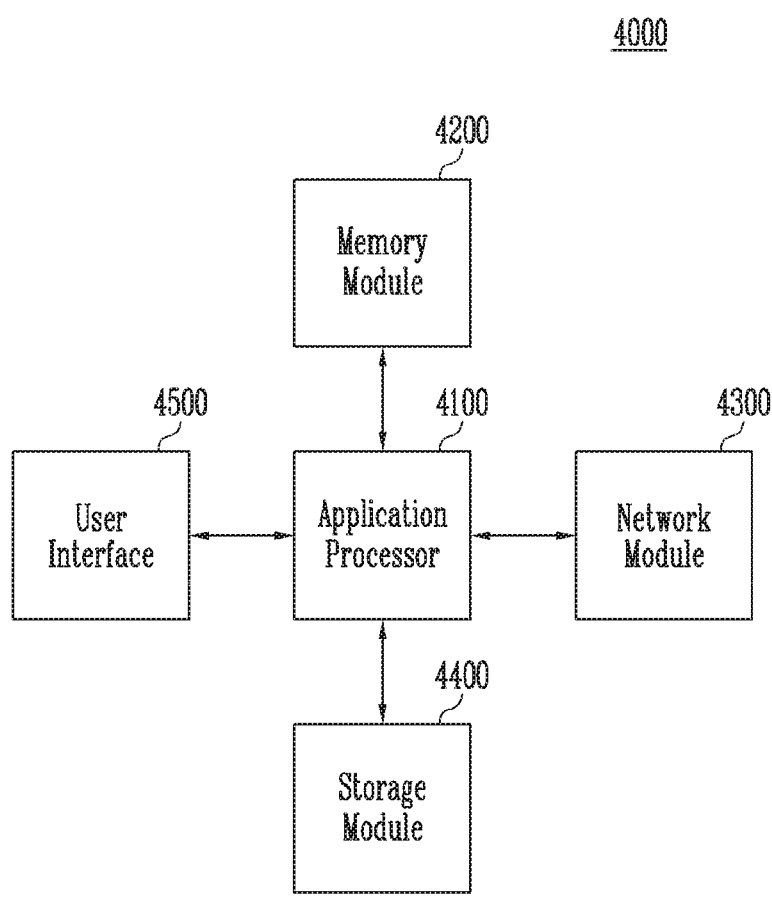
FIG. 22 is a block diagram illustrating an example of a user system including the storage device implemented based on an embodiment of the present disclosure.

FIG. 22 is a block diagram illustrating an example of a user system including the storage device implemented based on an embodiment of the disclosed technology.

Referring to FIG. 22, a user system 4000 may include an application processor 4100, a memory module 4200, a network module 4300, a storage module 4400, and a user interface 4500.

The application processor 4100 may run components included in the user system 4000, an Operating System (OS) or a user program. In an embodiment, the application processor 4100 may include controllers, interfaces, graphic engines, etc. for controlling the components included in the user system 4000. The application processor 4100 may be provided as a system-on-chip (SoC).

The memory module 4200 may function as a main memory, a working memory, a buffer memory or a cache memory of the user system 4000. The memory module 4200 may include volatile RAMs such as DRAM, SDRAM, DDR SDRAM, DDR2 SDRAM, DDR3 SDRAM, LPDDR SDRAM, and LPDDR3 SDRAM, or nonvolatile RAMs such as PRAM, ReRAM, MRAM, and FRAM. In an embodiment, the application processor 4100 and the memory module 4200 may be packaged based on package-on-package (POP) and may then be provided as a single semiconductor package.

The network module 4300 may communicate with external devices. For example, the network module 4300 may support wireless communication, such as Code Division Multiple Access (CDMA), Global System for Mobile communication (GSM), wideband CDMA (WCDMA), CDMA-2000, Time Division Multiple Access (TDMA), Long Term Evolution (LTE), WiMAX, WLAN, UWB, Bluetooth, or Wi-Fi communication. In an embodiment, the network module 4300 may be included in the application processor 4100.

The storage module 4400 may store data. For example, the storage module 4400 may store data received from the application processor 4100. Alternatively, the storage module 4400 may transmit the data stored in the storage module 4400 to the application processor 4100. In an embodiment, the storage module 4400 may be implemented as a nonvolatile semiconductor memory device, such as a Phase-change RAM (PRAM), a Magnetic RAM (MRAM), a Resistive RAM (RRAM), a NAND flash memory, a NOR flash memory, or a NAND flash memory having a three-dimensional (3D) structure. In an embodiment, the storage module 4400 may be provided as a removable storage medium (i.e., removable drive), such as a memory card or an external drive of the user system 4000.

In an embodiment, the storage module 4400 may include a plurality of nonvolatile memory devices, each of which may be operated in the same way as the memory device 100 described above with reference to FIG. 1. The storage module 4400 may be operated in the same way as the storage device 50 described above with reference to FIG. 1.

The user interface 4500 may include interfaces which input data or instructions to the application processor 4100 or output data to an external device. In an embodiment, the user interface 4500 may include user input interfaces such as a keyboard, a keypad, a button, a touch panel, a touch screen, a touch pad, a touch ball, a camera, a microphone, a gyroscope sensor, a vibration sensor, and a piezoelectric device. The user interface 4500 may further include user output interfaces such as a Liquid Crystal Display (LCD), an Organic Light Emitting Diode (OLED) display device, an Active Matrix OLED (AMOLED) display device, an LED, a speaker, and a monitor.

In various embodiments of the disclosed technology, therefore, a memory controller may reduce/minimize the over-erase phenomenon.

What is claimed is:

1. A memory controller for controlling a memory device including a plurality of memory blocks, the memory controller comprising:
   a suspend detector configured to count a number of iterations that an erase operation on an erase target memory block, among the plurality of memory blocks, has been suspended until the erase operation is completed, and to generate suspend count information based on the number of iterations;
   a soft program setting table configured to include soft program setting information that indicates soft program operating conditions determined based on the number of iterations; and
   a soft program processor configured to perform a soft program operation on the erase target memory block after the erase operation has been completed, using a soft program voltage set based on the soft program setting information and the suspend count information.

2. The memory controller according to claim 1, wherein the soft program operating conditions comprise at least one of a soft program start bias, a soft program pulse count, and a soft program pulse bias.

3. The memory controller according to claim 1, wherein the suspend detector generates the suspend count information including a suspend count value and erase operation information, wherein the suspend count value indicates the number of iterations that the erase operation has been suspended, and the erase operation information indicates whether the erase operation has been completed.

4. The memory controller according to claim 3, wherein the suspend detector acquires the erase operation information from the memory device through a status read response indicating whether the memory device has finished an operation according to a command from the memory controller.

5. The memory controller according to claim 3, wherein the suspend detector provides the generated suspend count information to the soft program processor and initializes the suspend count information.

6. The memory controller according to claim 1, wherein the soft program processor provides, to the memory device, a soft program command for the soft program operation and a set parameter command for setting the soft program voltage.

7. The memory controller according to claim 6, wherein the soft program operation includes applying a program pulse that shifts threshold voltages of a plurality of memory cells included in the erase target memory block to a set threshold voltage distribution.

8. A method of operating a memory controller, the memory controller controlling a memory device including a plurality of memory blocks, each including a plurality of memory cells, the method comprising:
   providing, to the memory device, an erase command for an erase target memory block, among the plurality of memory blocks;
   providing, to the memory device, a suspend command for the erase target memory block when suspension of an erase operation on the erase target memory block is requested;
   providing, to the memory device, an erase command for the erase target memory block after a suspend period corresponding to the suspend command has elapsed;
   counting a number of suspend commands provided to the memory device until the erase operation is completed; and
   providing a soft program command for a soft program operation on the erase target memory block based on the number of suspend commands.

9. The method according to claim 8, wherein providing the soft program command comprises generating suspend count information including a suspend count value and erase operation information,
   wherein the suspend count value indicates the number of suspend commands, and
   wherein the erase operation information indicates whether the erase operation has been completed.

10. The method according to claim 9, further comprising generating soft program setting information that indicates soft program operating conditions based on the generated suspend count information.

11. The method according to claim 10, wherein generating the soft program setting information comprises initializing the generated suspend count information after the soft program setting information has been generated.

12. The method according to claim 10, wherein the soft program operating conditions comprise at least one of a soft program start bias, a soft program pulse count, and a soft program pulse bias.

13. The method according to claim 10, wherein providing the soft program command further comprises providing, to the memory device, a set parameter command for setting a soft program voltage for the soft program operation based on the soft program setting information.

14. A memory controller for controlling a memory device including a plurality of memory blocks, each including a plurality of memory cells, the memory controller comprising:
- a soft program setting table configured to include soft program setting information that indicates soft program operating conditions determined based on a level of a hard erase verify voltage;
- a suspend detector configured to count a number of iterations that an erase operation on an erase target memory block, among the plurality of memory blocks, has been suspended until the erase operation is completed;
- a verify voltage determinator configured to perform a hard erase verify operation on the erase target memory block based on the number of iterations, and decide on a level of a fail verify voltage that is a hard erase verify voltage used when the hard erase verify operation fails; and
- a soft program processor configured to perform a soft program operation on the erase target memory block based on the level of the fail verify voltage and the soft program setting information.

15. The memory controller according to claim 14, wherein the verify voltage determinator decides on the level of the hard erase verify voltage based on the number of iterations, performs a read operation on memory cells included in the erase target memory block using the hard erase verify voltage, and decides on the level of the hard erase verify voltage as the level of the fail verify voltage when a number of OFF cells among the memory cells in the read operation, is equal to or greater than a set threshold value.

16. The memory controller according to claim 15, wherein the verify voltage determinator is further configured to, when the number of OFF cells is less than the set threshold value, perform the hard erase verify operation using an additional hard erase verify voltage lower than the hard erase verify voltage.

17. The memory controller according to claim 14, wherein the verify voltage determinator is further configured to:
- perform a read operation on memory cells included in the erase target memory block using each of a plurality of hard erase verify voltages different from each other, based on the number of iterations,
- determine at least one or more hard erase verify voltages for which a number of OFF cells among the memory cells in the read operation, is equal to or greater than a set threshold value, among the plurality of hard erase verify voltages, and
- decide on a level of a hard erase verify voltage at which the number of OFF cells is a minimum, among the at least one or more hard erase verify voltages, as the level of the fail verify voltage.

18. The memory controller according to claim 14, wherein the soft program processor provides a soft program command for the soft program operation to the memory device, and provides, to the memory device, a set parameter command for setting a soft program voltage for the soft program operation.

19. The memory controller according to claim 14, wherein the soft program operating conditions comprise at least one of a soft program start bias, a soft program pulse count, and a soft program pulse bias.

* * * * *